United States Patent
Cheng et al.

[11] Patent Number: 6,162,696
[45] Date of Patent: Dec. 19, 2000

[54] METHOD OF FABRICATING A FEATURE IN AN INTEGRATED CIRCUIT USING A TWO MASK PROCESS WITH A SINGLE EDGE DEFINITION LAYER

[75] Inventors: Peng Cheng, Campbell; Brian S. Doyle, Cupertino, both of Calif.

[73] Assignee: Intel Corporation, Santa Clara, Calif.

[21] Appl. No.: 09/160,012

[22] Filed: Sep. 24, 1998

Related U.S. Application Data

[63] Continuation-in-part of application No. 08/969,008, Nov. 10, 1997.

[51] Int. Cl.[7] .................................................. H01L 21/331
[52] U.S. Cl. ........................ 438/312; 438/314; 438/318; 438/309
[58] Field of Search .................................. 438/312, 313, 438/314, 315, 319, 320, 318, 309, 317, 321, 595, 596, 597, 94, 93; 257/37, 44

[56] References Cited

U.S. PATENT DOCUMENTS

| | | | |
|---|---|---|---|
| 4,744,859 | 5/1988 | Hu et al. ................................... | 156/643 |
| 5,466,615 | 11/1995 | Tsai ........................................... | 437/31 |
| 5,494,837 | 2/1996 | Subramanian et al. .................. | 437/34 |
| 5,496,756 | 3/1996 | Sharma et al. ............................ | 437/52 |
| 5,510,281 | 4/1996 | Ghezzo et al. ........................... | 437/41 |
| 5,610,099 | 3/1997 | Stevens et al. .......................... | 437/192 |

OTHER PUBLICATIONS

J.T. Hortsmann, et al.; "Characterization of Sub–100 nm–MOS–Transistors Processed by Optical Lithography and a Sidewall–Etchback Technique"; Faculty of Electrical Engineering. University of Dortmund, Emil–Figge–Str. 68, D 44220 Dortmund, Germany; 4 pages total.

H. Liu et al.; "100 nm CMOS Gates Patterned with 3 below 10nm" SPIE–The International Society for Optical Engineering. vol. 3331. pp. 375–381.

*Primary Examiner*—Charles Bowers
*Assistant Examiner*—Laura M Schillinger
*Attorney, Agent, or Firm*—Blakely, Sokoloff, Taylor & Zafman LLP

[57] ABSTRACT

A method of fabricating a feature on a substrate is described. In one embodiment, the fabricated feature is the gate electrode of an MOS transistor. A feature layer is formed on the substrate with a patterned edge definition layer then formed on the feature layer. Next, a spacer layer is formed adjacent to an edge of the patterned edge definition layer. Finally, the feature layer is etched, forming the transistor gate electrode from the feature layer that remains under the spacer.

28 Claims, 20 Drawing Sheets

METHOD OF FABRICATING A FEATURE IN AN INTEGRATED CIRCUIT USING A TWO MASK PROCESS WITH A SINGLE EDGE DEFINITION LAYER

RELATED APPLICATION

The present invention is a continuation-in-part to the U.S. patent application entitled "Method of Fabricating a Feature in an Integrated Circuit Using Two-Edge Definition Layers and a Spacer", Ser. No. 08/969,008, filed Nov. 10, 1997.

BACKGROUND OF THE INVENTION

1. Field of the Invention

The present invention relates generally to the field of semiconductor processing, and more particularly, to a method of fabricating a feature in an integrated circuit.

2. Description of the Related Art

A desire to increase the speed and density of integrated circuits (ICs) has led to progressive reductions in feature dimensions, particularly in the lengths of metal-oxide semiconductor (MOS) transistor gate electrodes. However, the reduction in feature dimensions is limited by a need to provide some margin for process variation, which is responsible for a difference between the target dimension and the minimum actual dimension typically yielded by the fabrication process. For example, given the process variation of conventional photolithography, it is difficult to manufacture MOS transistor gate electrodes with a target dimension of less than 150 nm. To overcome this difficulty, a process of gate definition referred to as Spacer Gate (SG) has been developed.

An example of an SG process flow on a semiconductor wafer is illustrated in FIGS. 1a through 1g, each of which represent a cross sectional view of the wafer. FIG. 1a shows a silicon substrate 101 with a gate oxide layer 102 formed thereon. A polysilicon layer 103 has then been formed on the gate oxide layer 102. The gate electrode of the future MOS transistor will be formed from the polysilicon layer 103.

FIG. 1b shows an edge definition area 104 of silicon dioxide that has been formed by patterning a layer of silicon dioxide using conventional photolithography and etching processes. The patterning of edge definition area 104 constitutes the first masking step of this SG process. FIG. 1c shows a silicon nitride spacer layer 105 formed on the wafer. FIG. 1d shows silicon nitride spacers 106 and 107 that have been formed on the edge of edge definition area 104 by an anisotropic each of spacer layer 105. FIG. 1e shows the wafer after edge definition area 104 has been etched away.

In FIG. 1e, spacers 106 and 107 remain on the wafer, as part of a continuous ring of silicon nitride that was formed around the entire edge of edge definition area 104. Since the area of gate electrode layer 103 that is covered by silicon nitride will not be subsequently removed and the desired pattern of the gate electrode is not a continuous ring, a portion of the silicon nitride ring must be removed. The removal of a portion of the silicon nitride ring is referred to as a nitride trim, which constitutes the second masking step of this SG process. In FIG. 1e, spacer 106 covers an area of polysilicon layer 103 that will become a portion of a gate electrode, but spacer 107 represents a portion of the spacer ring that must be trimmed. FIG. 1f shows spacer 106 covered by a photoresist trim mask 108, which is formed by conventional photolithography.

FIG. 1g shows the wafer after spacer 107 has been removed by a trim etch and trim mask 108 has been stripped.

The area of polysilicon layer 103 that is under spacer 106 will become a gate electrode with a length that depends on the length 109 of spacer 106. The length 109 of spacer 106 depends on the thickness of former spacer layer 105, so only features of the same length as the future gate electrode can be defined with this SG process. Therefore, a third masking step is needed to define features from polysilicon layer 103 that are of greater length than the future gate electrode. Such features might include transistor gate electrodes of greater than minimum length, polysilicon interconnect lines, and polysilicon contact pads. The photoresist mask used for this third masking step is referred to as a pad mask.

FIG. 1h shows pad mask 110 masking an area of polysilicon layer 103 that will be protected during polysilicon etch to form a contact pad. FIG. 1i shows gate electrode 111 and contact pad 112 after polysilicon etch. Next, pad mask 110 is stripped. Seal oxide 113, shown in FIG. 1j, is grown to protect the edges of gate electrode 111 and contact pad 112 during subsequent processing. Finally, FIG. 1k shows the wafer after spacer 106 has been etched away. The remainder of the transistor structure can be formed using conventional MOS processing.

The above-described method of fabricating a gate electrode using a spacer requires three masking steps. The relative high cost of processing and the long throughput time associated with the three-mask process make it difficult to integrate the three-mask process into a main stream MOS process. Further, process complexity and cost are directly related to the number of masking steps. Therefore, a method of fabricating a feature using a spacer that requires only two masking steps is desired.

SUMMARY OF THE INVENTION

The present invention describes a method of fabricating a feature on a substrate. A feature layer is first formed on the substrate. Next, a patterned edge definition layer is formed on the feature layer. A spacer is then formed adjacent to an edge of the patterned edge definition layer. Finally, an area of the feature layer that is not under the spacer is etched such that the feature is formed from the remaining area of the feature layer.

DESCRIPTION OF THE DRAWINGS

FIG. 2i-2 is an illustration of the wafer of FIG. 2a during the trim mask step of an alternative approach.

FIG. 2j-1 is an illustration of the wafer of FIG. 2a after trim etch.

FIG. 2j-2 is an illustration of the wafer of FIG. 2a in the flow of the alternative approach after trim etch.

FIG. 2k-1 is an illustration of the wafer of FIG. 2a after an etch of the patterned second EDL.

FIG. 2k-2 is an illustration of the wafer of FIG. 2a in the flow of the alternative approach after an etch of the patterned second EDL.

FIG. 2l-1 is an illustration of the wafer of FIG. 2a after the trim mask has been removed.

FIG. 2l-2 is an illustration of the wafer of FIG. 2a in the flow of an alternative approach after the trim mask has been removed.

FIG. 3g-1 is an illustration of the wafer of FIG. 3a after spacer etch.

FIG. 3g-2 is an illustration of the wafer of FIG. 3a in the flow of an alternative approach during the trim mask step.

FIG. 3h-1 is an illustration of the wafer of FIG. 3a during the trim mask step.

FIG. 3h-2 is an illustration of the wafer of FIG. 3a in the flow of an alternative approach after trim etch.

FIG. 3i-1 is an illustration of the wafer of FIG. 3a after trim etch.

FIG. 3i-2 is an illustration of the wafer of FIG. 3a in the flow of an alternative approach after an etch of the patterned EDL.

FIG. 3j-1 is an illustration of the wafer of FIG. 3a after an etch of the patterned EDL.

FIG. 3j-2 is an illustration of the wafer of FIG. 3a in the flow of an alternative approach after the trim mask has been removed.

FIG. 3l-1 is an illustration of the wafer of FIG. 3a after an etch of the feature layer.

FIG. 3l-2 is an illustration of the wafer of FIG. 3a in the flow of an alternative approach after a partial etch of the feature layer.

FIG. 3l-3 is an illustration of the wafer of FIG. 3a in the flow of an alternative approach after an etch of the patterned EDL and spacer.

DETAILED DESCRIPTION OF THE INVENTION

A method of fabricating a feature in an integrated circuit is described. In the following description, numerous specific details are set forth in order to provide a thorough understanding of the present invention. It will be apparent, however, to one skilled in the art that the present invention can be practiced without regard to these specific details. In other instances, well-known processes and structures have not been described in detail in order to avoid obscuring the present invention. Also, although a description of the fabrication of a metal-oxide semiconductor (MOS) transistor gate electrode is described, the present invention can be used to fabricate any feature in an integrated circuit.

Figure 1A:
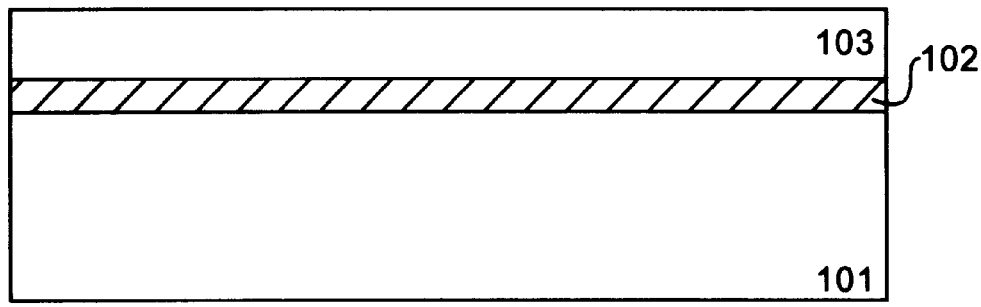
FIG. 1a is a cross-sectional illustration of a semiconductor wafer upon which a feature will be formed according to a known spacer gate process.
Figure 1B:
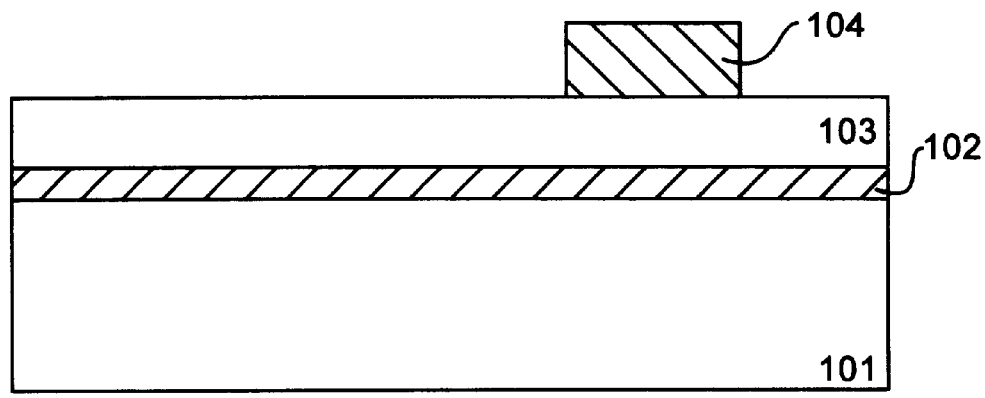
FIG. 1b is an illustration of the wafer of FIG. 1a after an edge definition layer (EDL) has been formed.
Figure 1C:
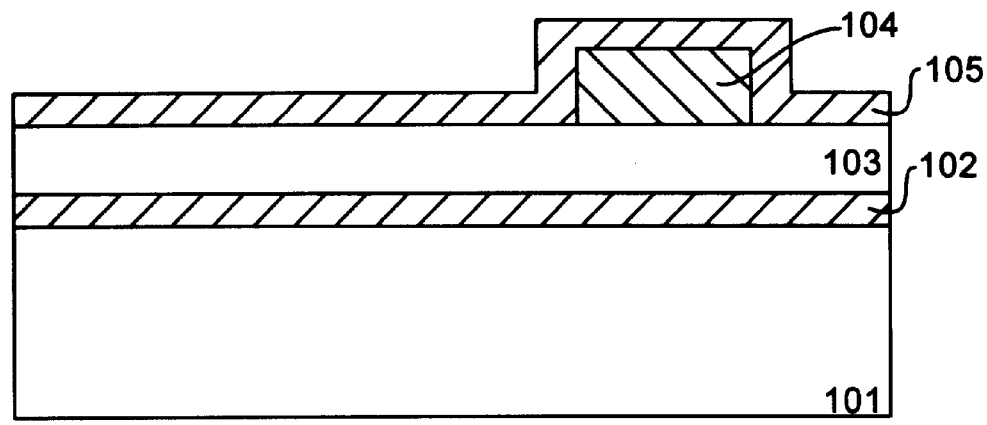
FIG. 1c is an illustration of the wafer of FIG. 1a after a spacer layer has been formed.
Figure 1D:
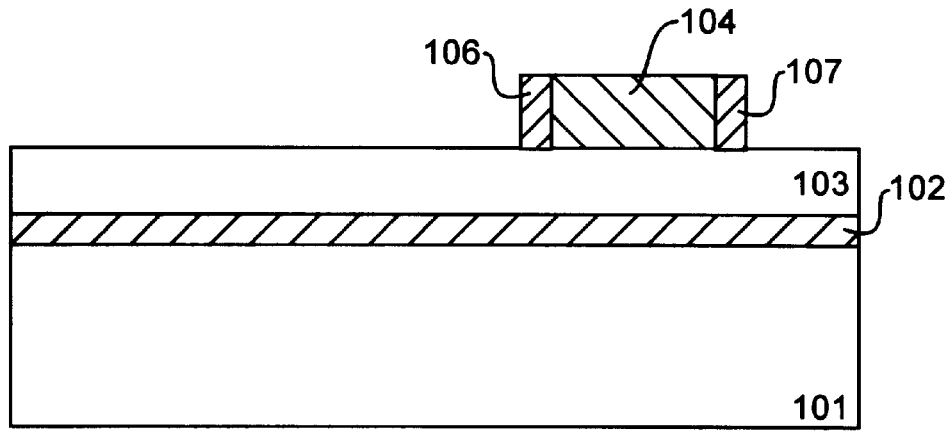
FIG. 1d is an illustration of the wafer of FIG. 1a after spacers have been formed.
Figure 1E:
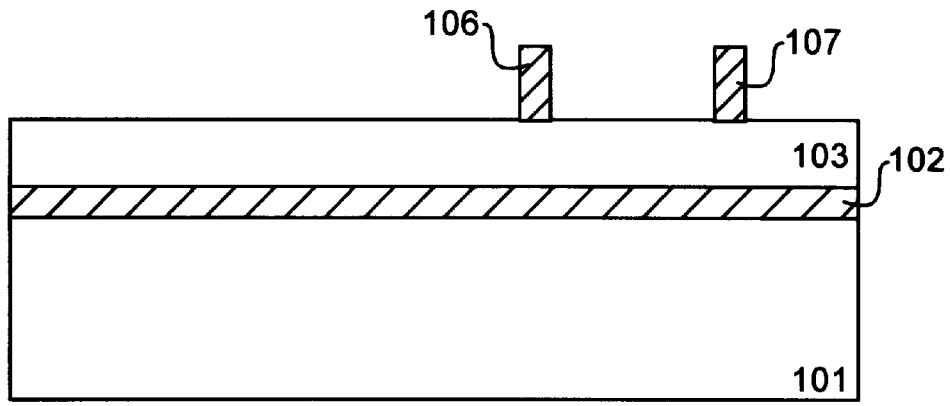
FIG. 1e is an illustration of the wafer of FIG. 1a after the EDL has been etched.
Figure 1F:
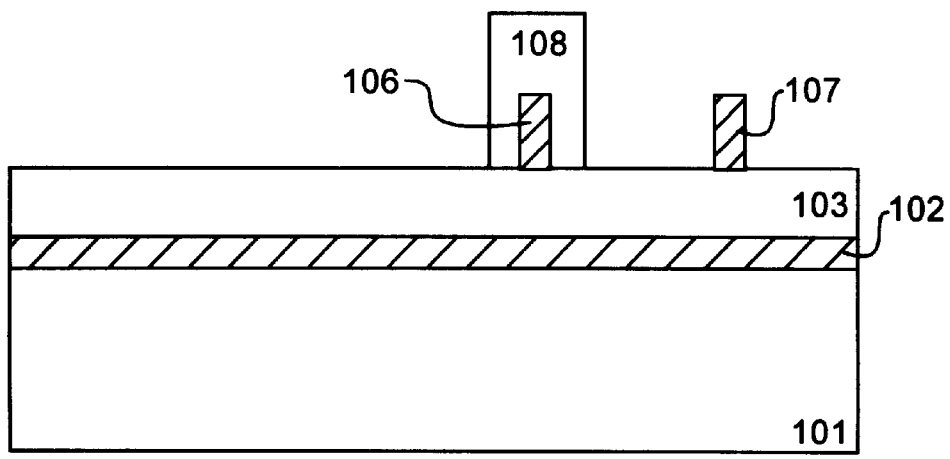
FIG. 1f is an illustration of the wafer of FIG. 1a during the trim mask step.
Figure 1G:
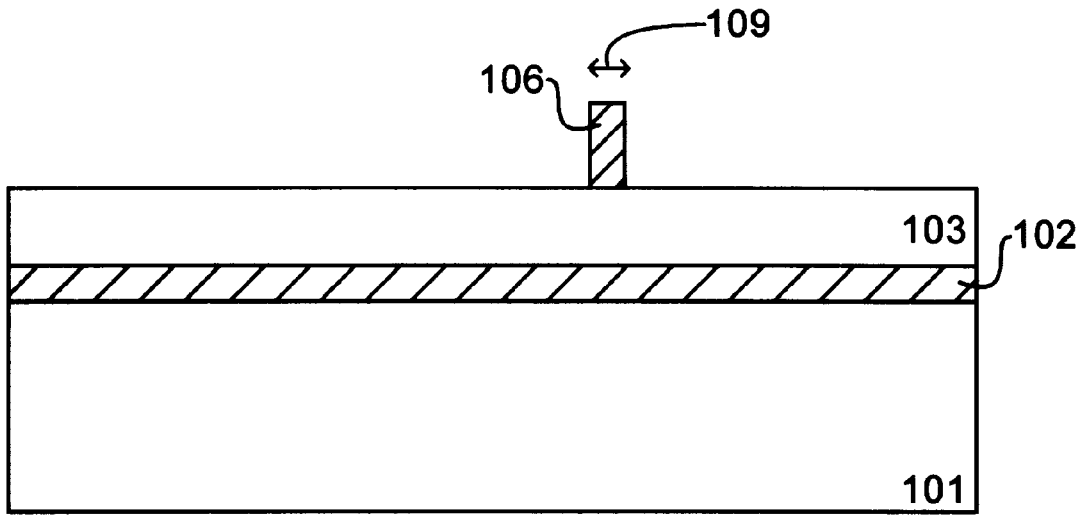
FIG. 1g is an illustration of the wafer of FIG. 1a after trim etch.
Figure 1H:
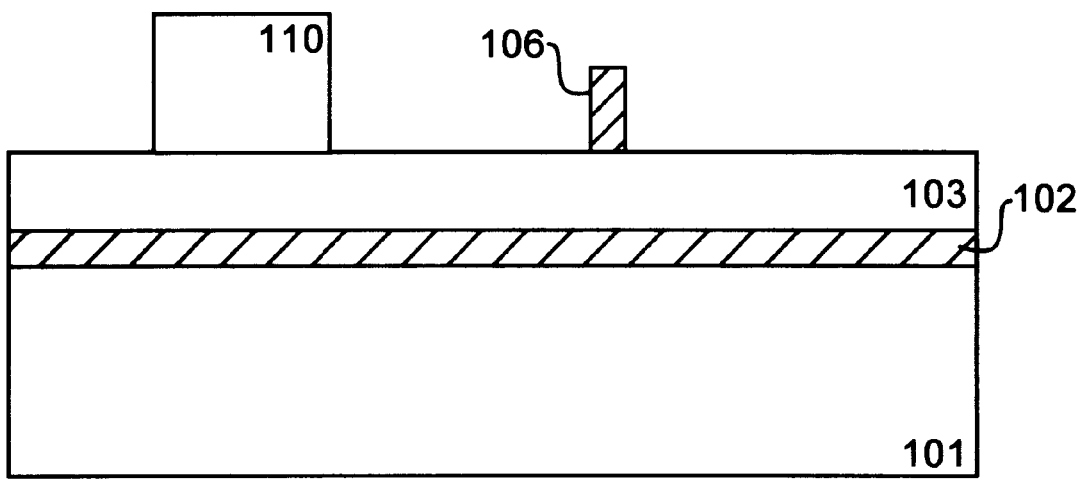
FIG. 1h is an illustration of the wafer of FIG. 1a during the pad mask step.
Figure 1I:
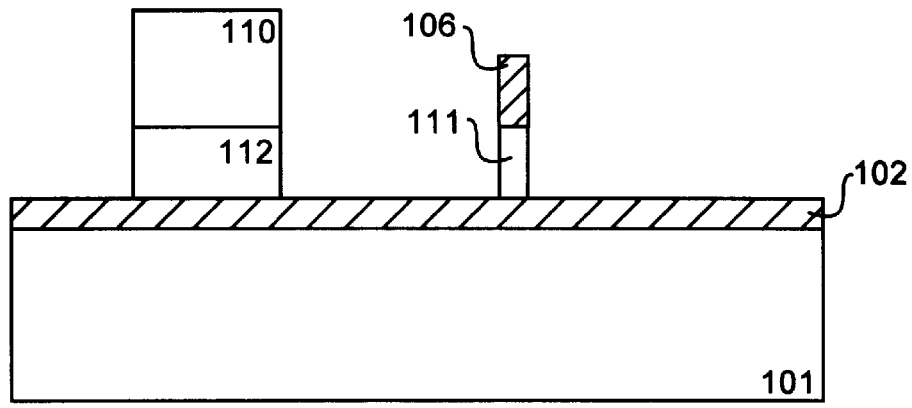
FIG. 1i is an illustration of the wafer of FIG. 1a after polysilicon etch.
Figure 1J:
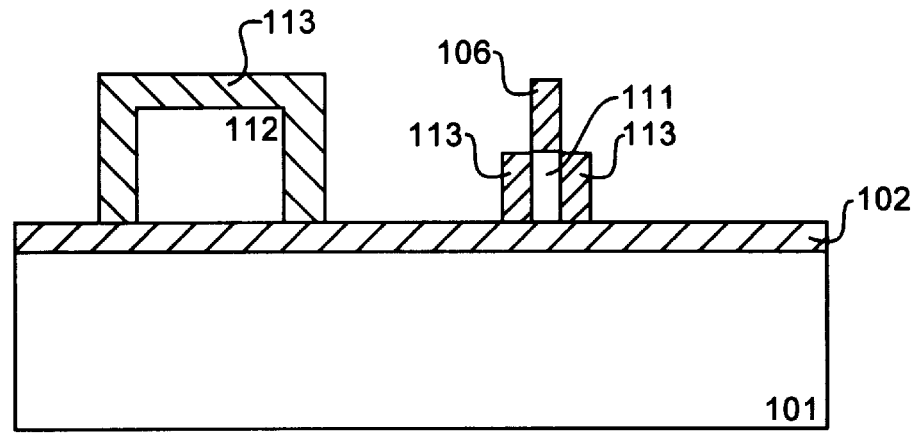
FIG. 1j is an illustration of the wafer of FIG. 1a after a seal oxide is grown.
Figure 1K:
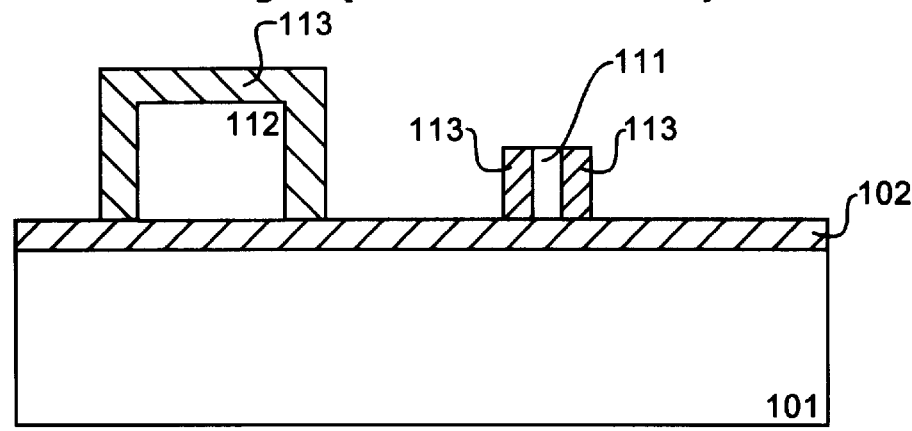
FIG. 1k is an illustration of the wafer of FIG. 1a after the spacer has been etched.
Figure 2A:
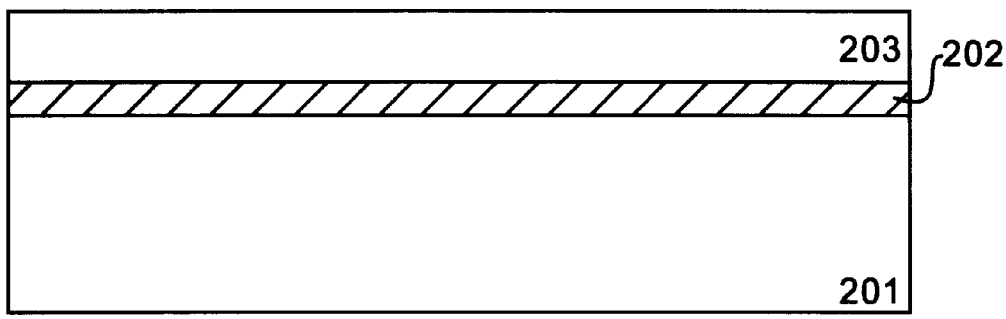
FIG. 2a is a cross-sectional illustration of a semiconductor wafer upon which a feature will be formed according to an embodiment of the present invention.
Figure 2B:
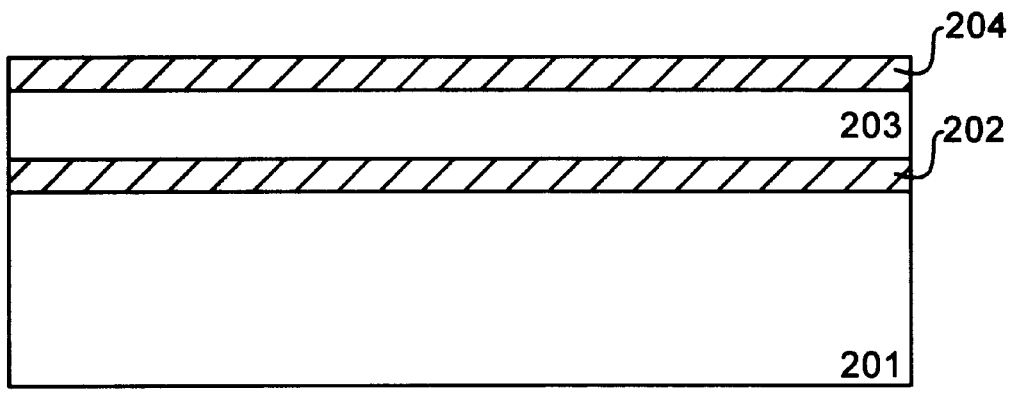
FIG. 2b is an illustration of the wafer of FIG. 2a after a first EDL has been formed.
Figure 2C:
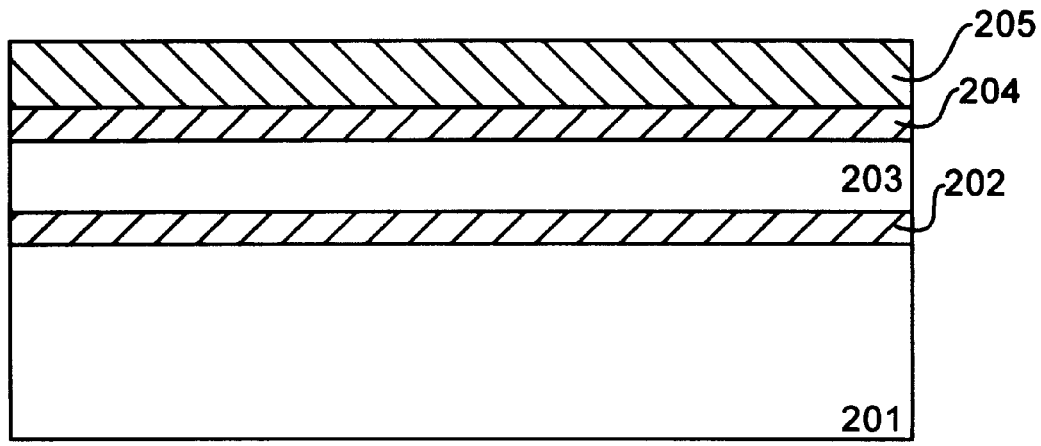
FIG. 2c is an illustration of the wafer of FIG. 2a after a second EDL has been formed.
Figure 2D:
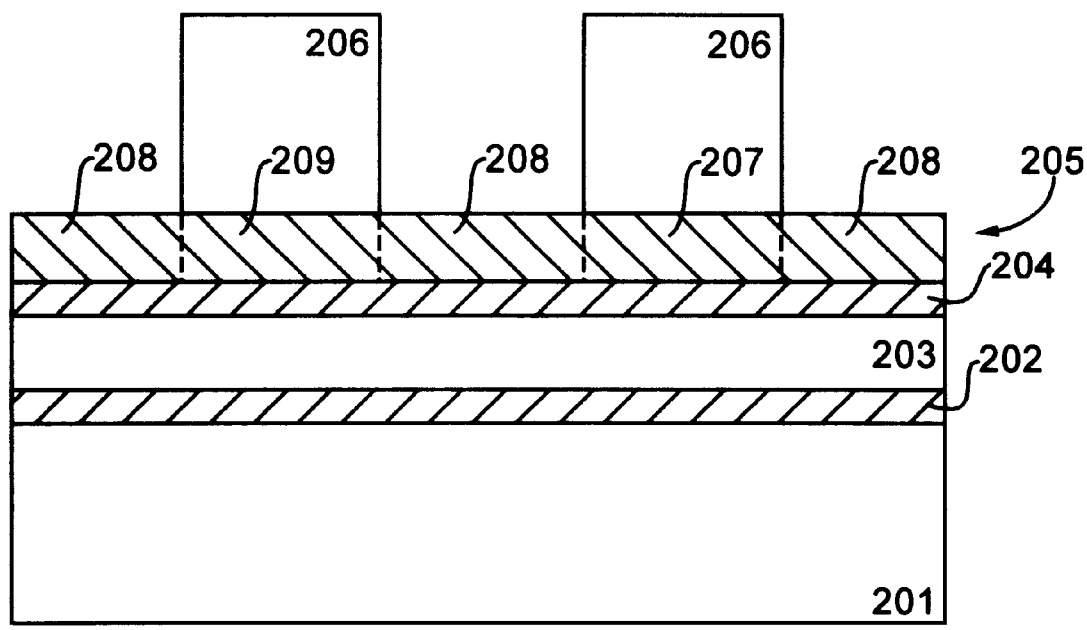
FIG. 2d is an illustration of the wafer of FIG. 2a during the edge definition masking step.
Figure 2E:
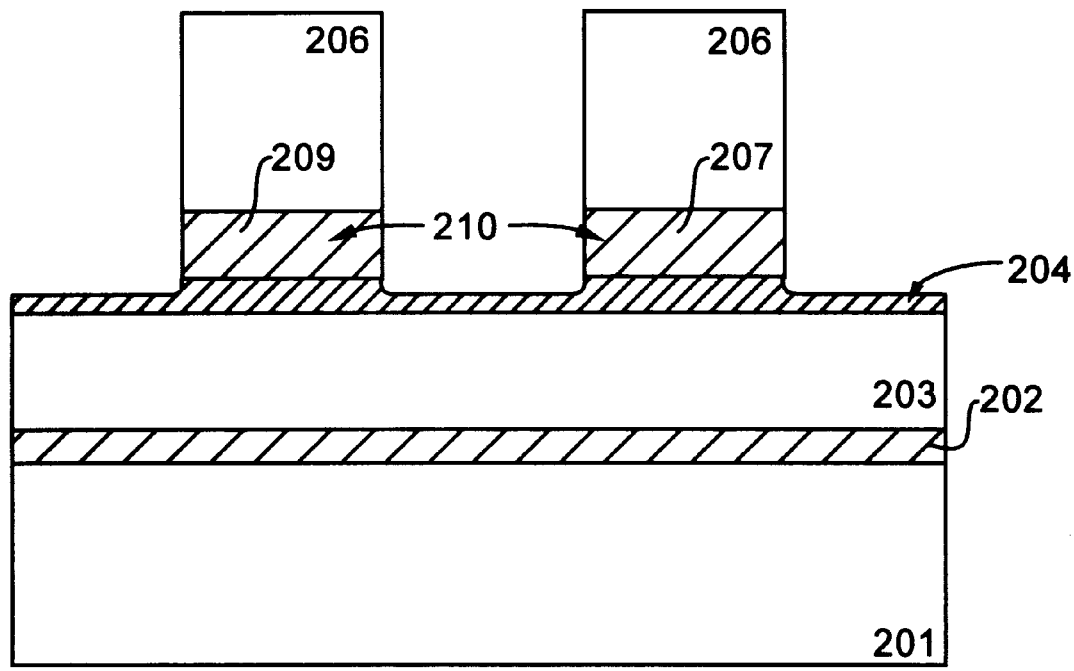
FIG. 2e is an illustration of the wafer of FIG. 2a after a patterned second EDL has been formed.
Figure 2F:
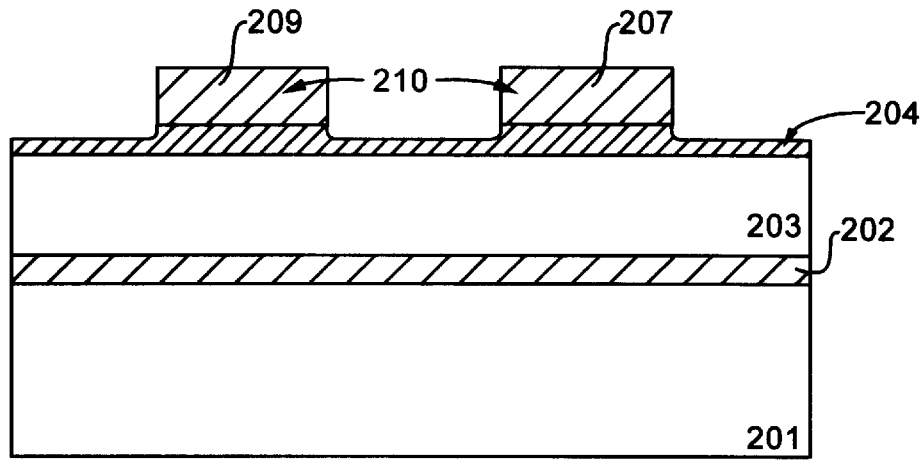
FIG. 2f is an illustration of the wafer of FIG. 2a after the edge definition mask has been removed.
Figure 2G:
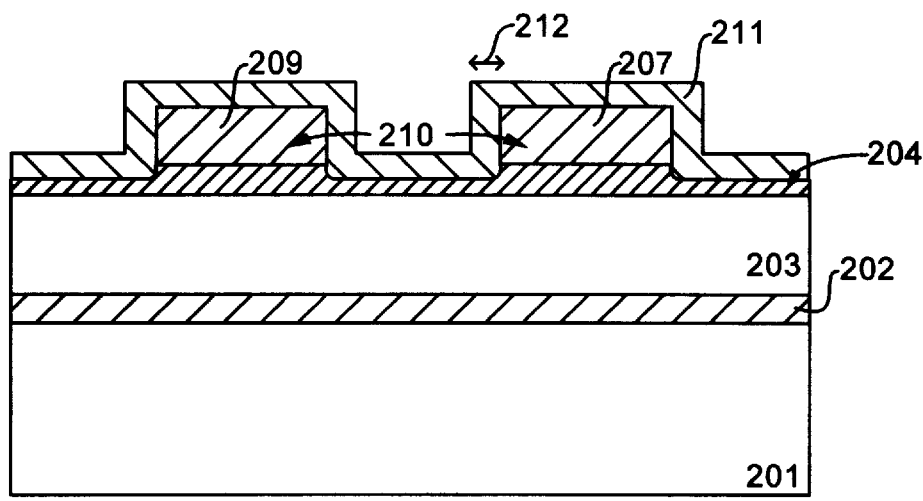
FIG. 2g is an illustration of the wafer of FIG. 2a after a spacer layer has been formed.
Figure 2H:
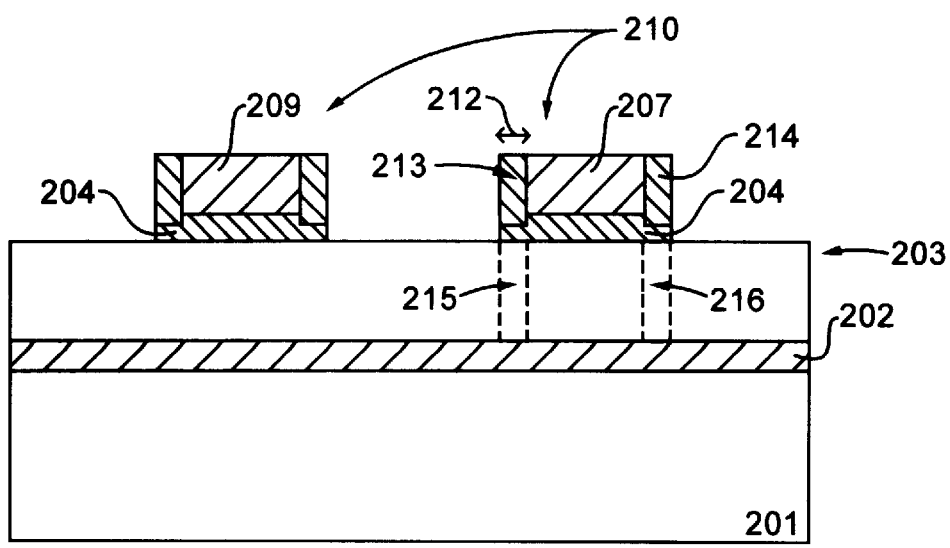
FIG. 2h is an illustration of the wafer of FIG. 2a after spacer etch.
Figures 1, 2I:
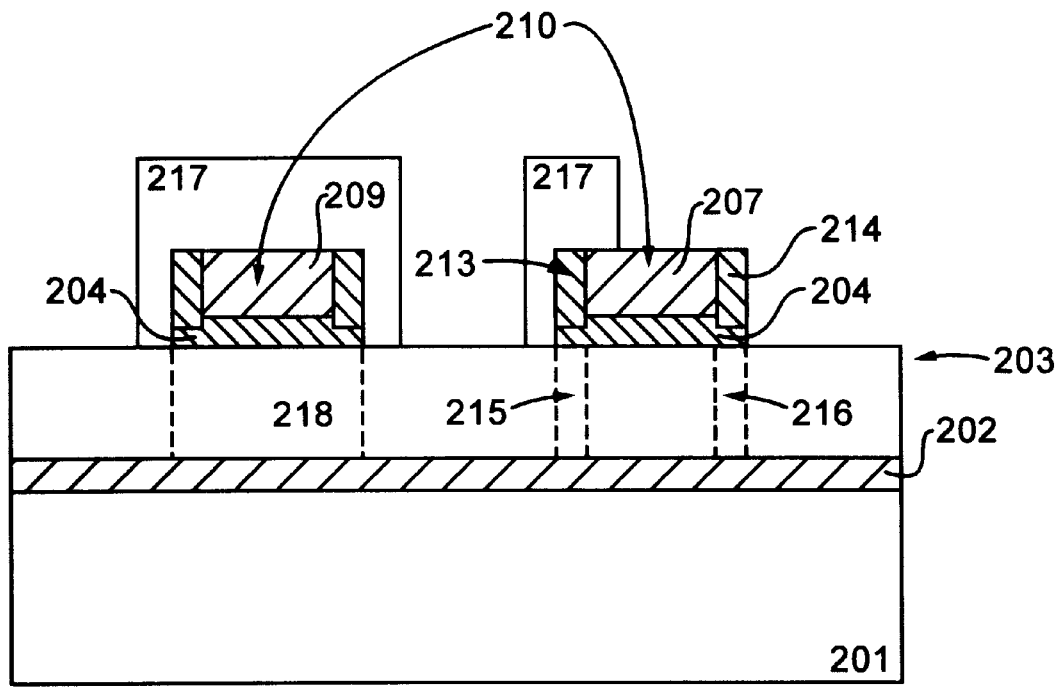
FIG. 2i-1 is an illustration of the wafer of FIG. 2a after during the trim mask step.
Figures 2, 2I:
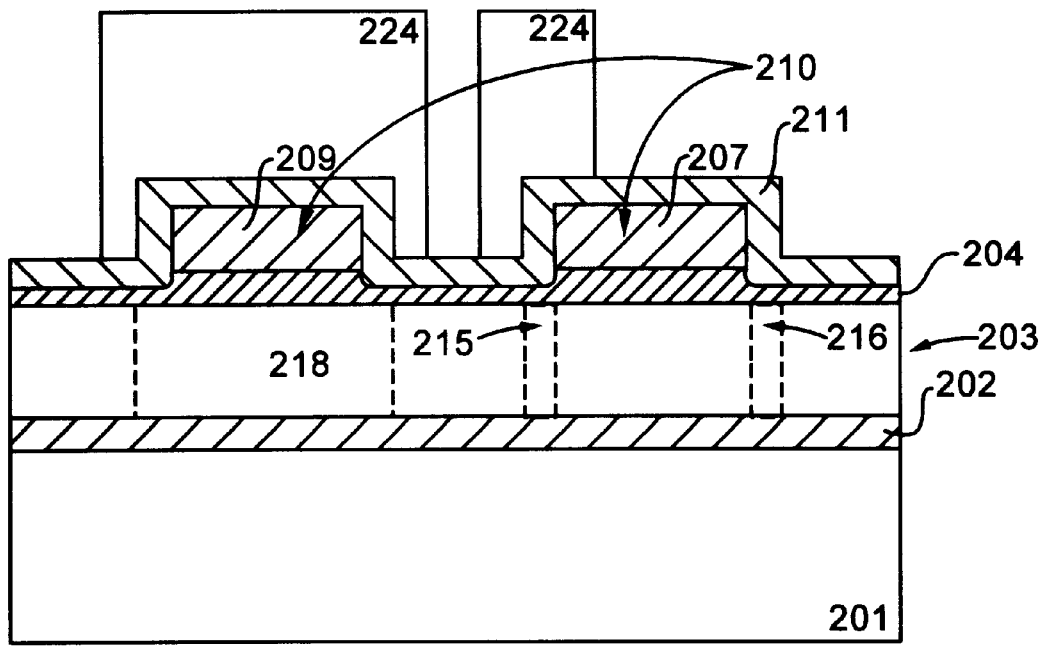
Figures 1, 2J:
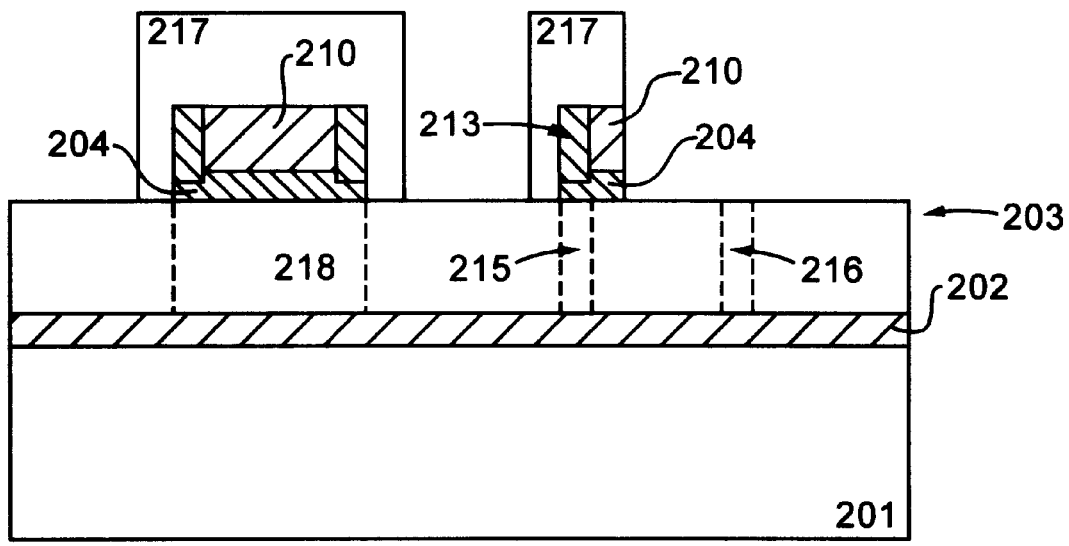
Figures 2, 2J:
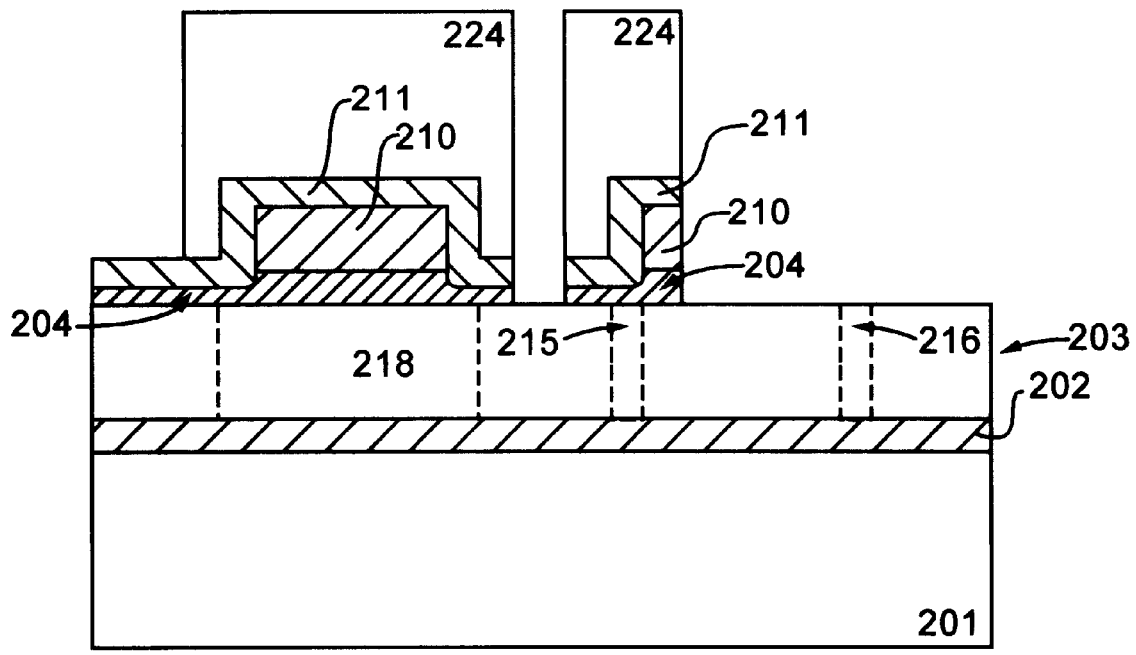
Figures 1, 2K:
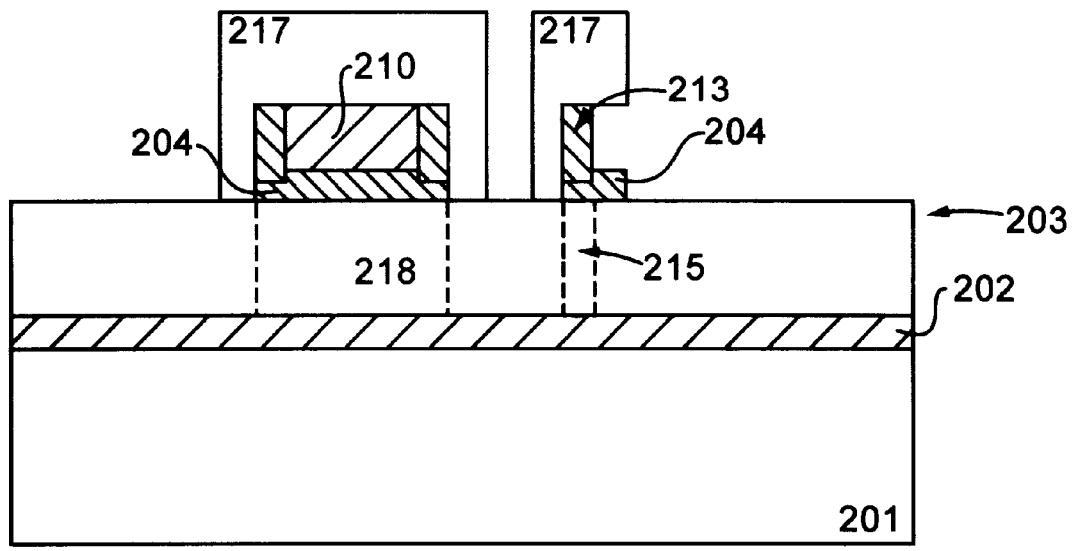
Figures 2, 2K:
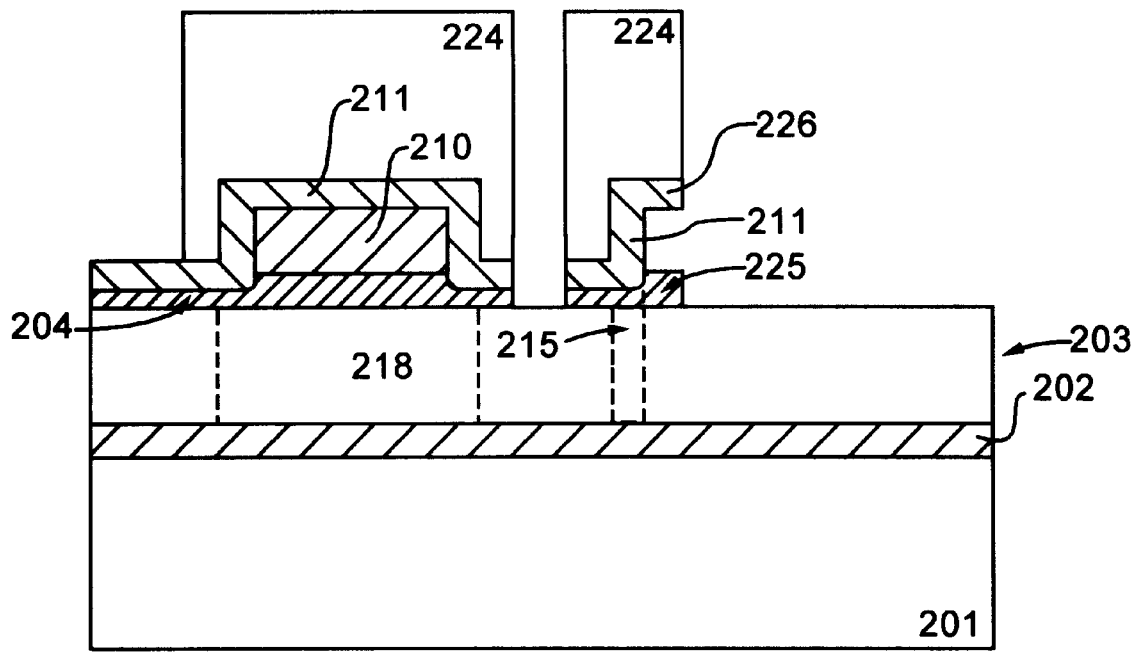
Figures 1, 2I:
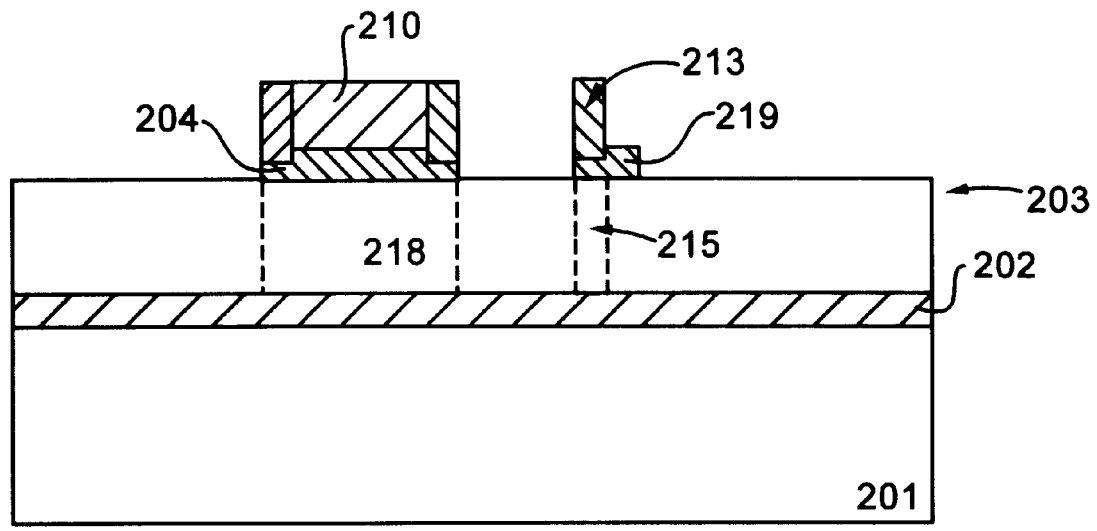
Figures 2, 2I:
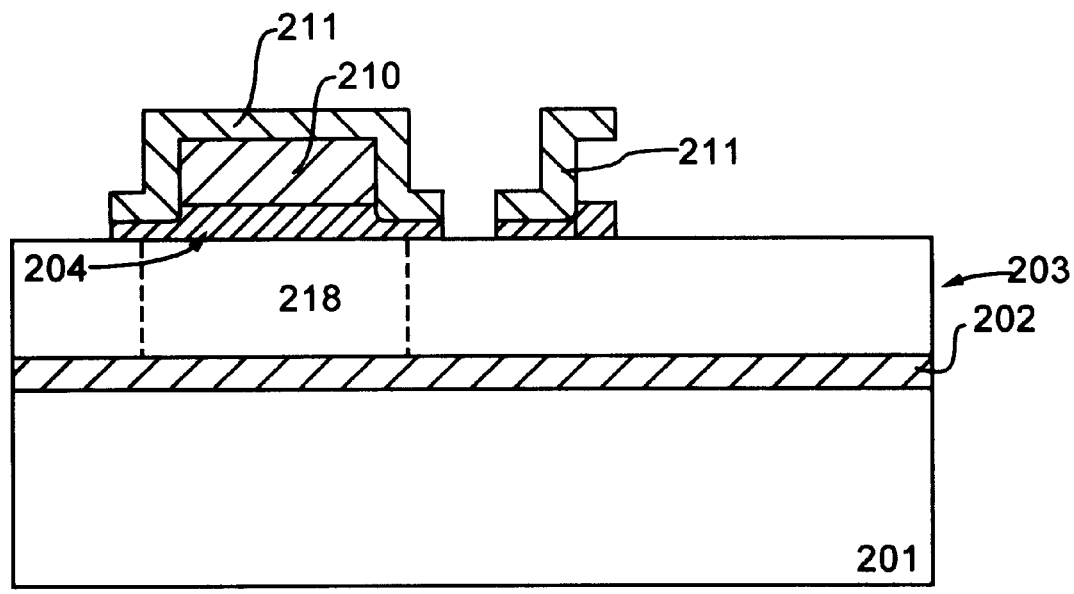
Figure 2M:
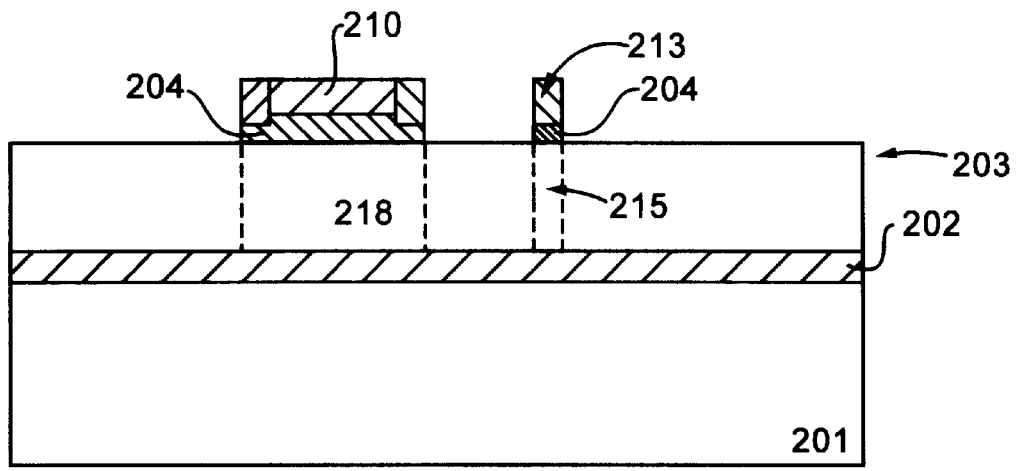
FIG. 2m is an illustration of the wafer of FIG. 2a after any ledges adjacent to spacer are etched away.
Figure 2N:
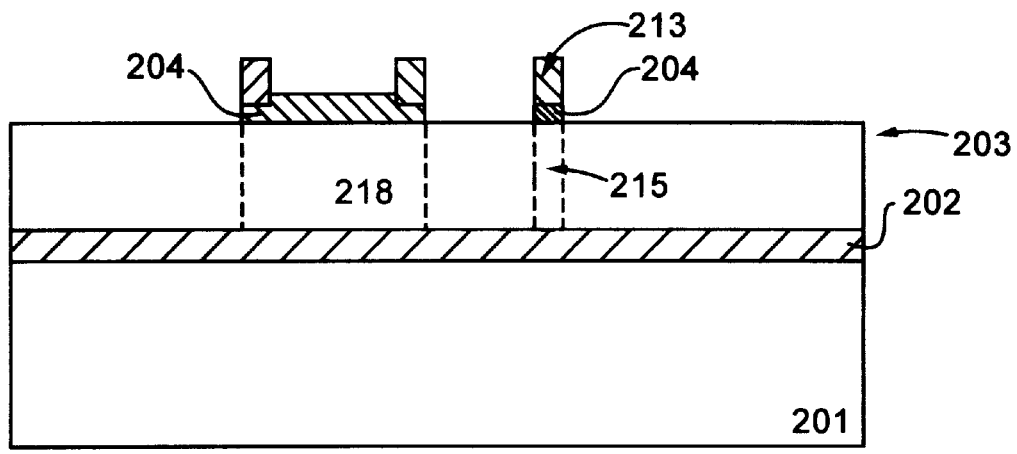
FIG. 2n is an illustration of the wafer of FIG. 2a after an etch of the patterned second EDL.
Figure 2O:
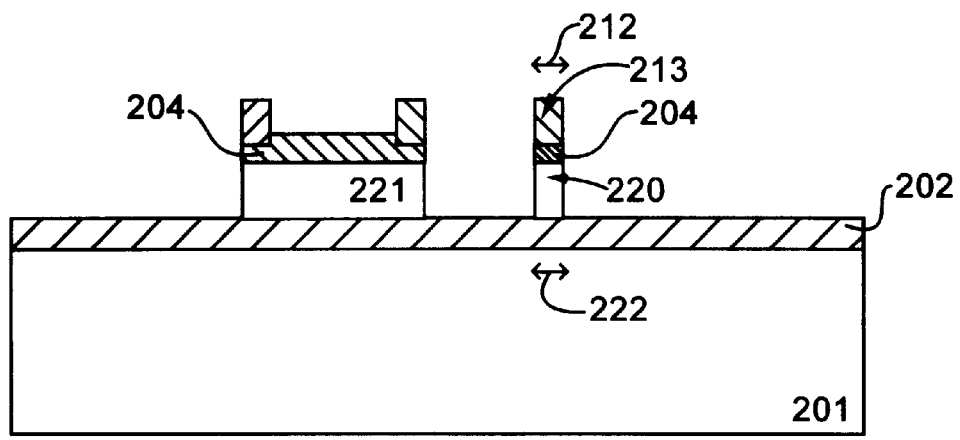
FIG. 2o is an illustration of the wafer of FIG. 2a after an etch of the feature layer.
Figure 2P:
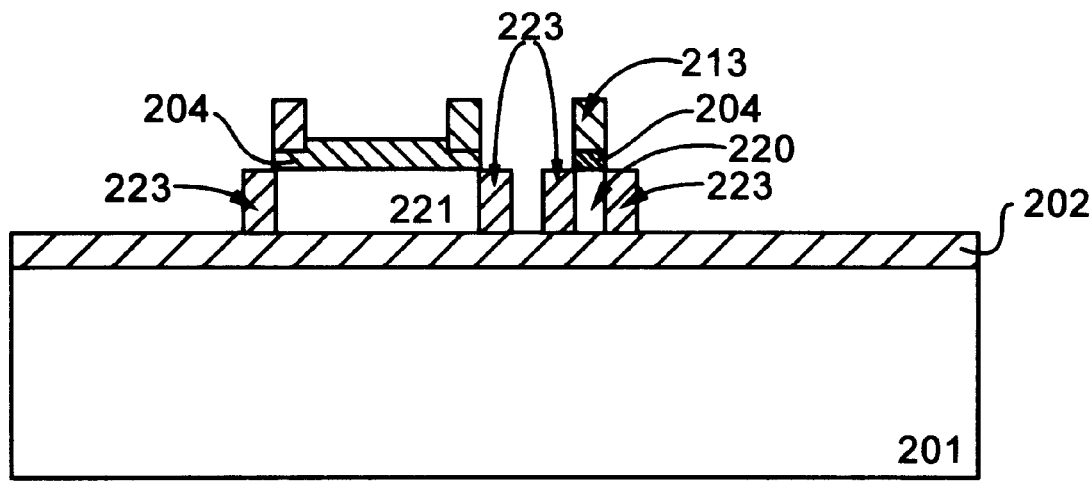
FIG. 2p is an illustration of the wafer of FIG. 2a after a seal layer has been formed
Figure 2Q:
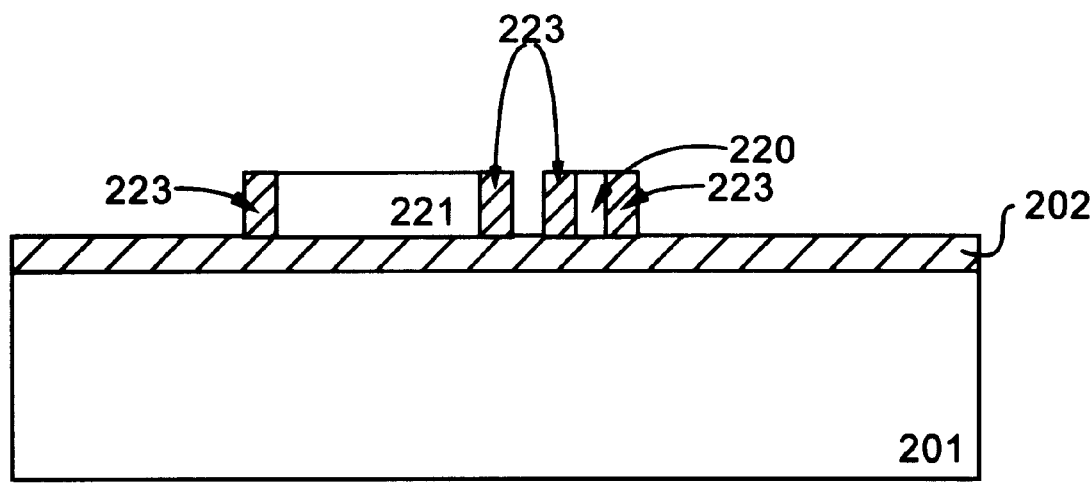
FIG. 2q is an illustration of the wafer of FIG. 2a after the spacer has been etched.

FIGS. 2a through 2q depict an embodiment of the present invention that is a Spacer Gate (SG) process of fabricating an MOS transistor gate electrode on a semiconductor wafer. Each of FIGS. 2a through 2q illustrates a cross-sectional view of the wafer. The process represented by FIGS. 2a through 2q involves the formation of a silicon nitride spacer on a polysilicon layer. The process includes the formation of two edge definition layers, the latter of which is patterned to provide an edge on which to form the spacer. The spacer is formed by conformally depositing, then anisotropically etching a spacer layer. The spacer is used to define a feature, in this embodiment a gate electrode of an MOS transistor in the polysilicon layer by protecting the polysilicon underneath the spacer during a subsequent polysilicon etch. This process includes only two masking steps, demonstrating one advantage of the invention over the related art. However, the invention can also be practiced in a process that uses a different number of masking steps.

FIG. 2a shows a semiconductor substrate 201. Semiconductor substrate 201 can be silicon, silicon on an insulator, germanium, gallium arsenide, or any other substrate on which integrated circuits can be built. A gate dielectric layer 202 has been formed by any well-known technique on semiconductor substrate 201. Gate dielectric layer 202 can comprise silicon dioxide, silicon nitride, lead strontium, barium strontium, aluminum oxide, tantalum pentoxide, or any other dielectric material. Gate dielectric layer 202 is preferably between 100 nm and 500 nm thick. A feature layer 203 has been formed by any well-known technique on gate dielectric layer 202. Feature layer 203 can comprise any material from which a feature of an integrated circuit can be made, such as but not limited to conductive materials comprising polysilicon, aluminum, or copper. In this embodiment, feature layer 203 comprises polysilicon, from which the gate electrode of an MOS transistor will be fabricated. Feature layer 203 is preferably between 100 nm and 350 nm thick.

FIG. 2b shows the wafer after a first edge definition layer (EDL) 204 has been formed by any well-known technique. First EDL 204 can comprise any material used in semiconductor processing, such as but not limited to insulating materials comprising silicon nitride or silicon dioxide. In this embodiment, first EDL 204 preferably comprises silicon nitride because silicon nitride is a preferred material for masking a polysilicon etch. First EDL 204 is preferably thick enough to act as a mask for a subsequent etch of feature layer 203, yet not so thick as to unnecessarily increase processing time or cost. The preferred thickness of EDL 204 is between 100 nm and 300 nm.

FIG. 2c shows the wafer after a second EDL 205 has been formed by any well-known technique. Second EDL 205 can comprise any material used in semiconductor processing, such as but not limited to insulating materials comprising silicon nitride or silicon dioxide. However, the composition of second EDL 205 is preferably different from the composition of first EDL 204 so that second EDL 205 can be selectively removed. Therefore, in this embodiment, second EDL 205 preferably comprises silicon dioxide. Second EDL 205 is preferably thick enough to subsequently provide an edge on which a spacer of sufficient height to mask an etch of feature layer 203 can be formed, yet not so thick as to unnecessarily increase processing time or cost. The preferred thickness of second EDL 205 is between 100 nm and 500 nm.

FIG. 2d shows the wafer during edge definition, the first masking step of the process of this embodiment. Edge definition mask 206 has been formed over a first area 207 of second EDL 205, but not over a second area 208 of second EDL 205. Edge definition mask 206 is used to define a pattern in second EDL 205 so that spacers can be formed on the edges of the pattern. In this embodiment, a spacer is used to define the minimum length gate electrode of an MOS transistor. Edge definition mask 206 can also be used to protect other areas of second EDL 205, under which feature layer 203 will be preserved, used to form features that are not of the same length as the gate electrode defined by the spacer. Such features can be, but are not limited to, transistor gate electrodes of greater than minimum length, polysilicon interconnect lines, and polysilicon contact pads. For example, in FIG. 2d, edge definition mask 206 has been formed over a third area 209 of second EDL 205. Edge definition mask 206 is preferably formed from a photoresist material using conventional photolithography techniques.

FIG. 2e shows the wafer after the second area 208 of second EDL 205 has been etched away to form a patterned second EDL 210. An anisotropic etch, such as a plasma etch or a reactive ion etch, is preferred so that the resulting edges in second EDL 205 are substantially vertical. The etch can remove some or substantially all of the area of first EDL 204 that was under second area 208 of second EDL 205, but preferably does not remove a significant amount of feature layer 203. FIG. 2f then shows the wafer after edge definition mask 206 has been removed. Techniques for removing conventional photoresist masks are well known in the art.

FIG. 2g shows the wafer after a spacer layer 211 has been formed. Spacer layer 211 can comprise any material used in semiconductor processing, such as but not limited to insulating materials comprising silicon nitride or silicon dioxide. Spacer layer 211 and first EDL 204 preferably comprise a common material so as to limit process complexity. Therefore, in this embodiment, spacer layer 211 comprises silicon nitride, and preferably comprises primarily silicon nitride. Spacer layer 211 is preferably conformally deposited such that the shape of the underlying topography determines the shape of spacer layer 211. Therefore, the length 212 of spacer layer 211 adjacent to an edge of patterned second EDL 210 is approximately equal to the thickness of spacer layer 211. Consequently, the length of the feature defined by the future spacer will be directly related to the thickness of spacer layer 211. Because conventional photolithography is generally acceptable for defining features with lengths greater than 250 nm, the thickness of spacer layer 211 is preferably below 250 nm and more preferably approximately 100 nm. Spacer layer 211 can be formed using well-known techniques such as low-pressure chemical vapor deposition.

FIG. 2h shows the wafer after spacer etch, which removes substantially all of spacer layer 211 that is not adjacent to an edge of patterned second EDL 210, where spacers such as spacer 213 and spacer 214 are formed. Spacer etch is preferably an anisotropic etch, such as a plasma or reactive ion etch, so that the length 212 of spacer 213 remains approximately equal to the former thickness of spacer layer 211.

Spacer 213 covers a first area 215 of feature layer 203 that will become the gate electrode of an MOS transistor. Spacer 214, on the other hand, covers a second area 216 of feature layer 203 that will need to be removed in order to prevent the formation of an undesired continuous ring of feature layer material around the perimeter of first area 207 of patterned second EDL 210. Therefore, spacer 214 will be removed during nitride trim, the second and final masking step of the process of the embodiment.

FIG. 2i-1 shows the wafer during the second masking step. Trim mask 217 has been formed over spacer 213 but not over spacer 214. Trim mask 217 can also be used to protect areas of patterned second EDL 210, under which feature layer 203 will be preserved to form features that are not of the same length as the gate electrode defined by the spacer. Such features can be, but are not limited to, transistor gate electrodes of greater than minimum length, polysilicon interconnect lines, and polysilicon contact pads. For example, in FIG. 2i-1, trim mask 217 has also been formed over a third area 218 of feature layer 203. Trim mask 217 is preferably formed from a photoresist material using conventional photolithography techniques.

FIG. 2j-1 shows the wafer after trim etch. Trim etch removes spacer 214, and preferably substantially all of the patterned second EDL 210 and first EDL 204 that is not covered by trim mask 217. Techniques for performing trim etch are well known in the art.

FIG. 2k-1 shows the wafer after an etch of patterned second EDL 210. An isotropic etch, such as a wet etch, is preferred so that substantially all of the material of the patterned second EDL 210 that is adjacent to spacer 213 is removed. FIG. 2l-1 shows the wafer after trim mask 217 has been removed. Techniques for removing conventional photoresist masks are well known in the art.

FIG. 2l-1 shows a ledge 219 of material from first EDL 204 that was not removed during trim etch. An etch of first EDL 204 is performed to remove ledge 219. An anisotropic etch, such as a plasma or a reactive ion etch, is preferred so that the length 212 of spacer 213 remains approximately equal to the former thickness of spacer layer 211. FIG. 2m shows the wafer after ledge 219 has been etched away.

FIG. 2n shows the wafer after an etch of patterned second EDL 210. An etch in which the rate of removal of the material of patterned second EDL 210 is significantly greater than the rate of removal of first EDL 204 is preferred, so that the etch step removes substantially all of the remainder of patterned EDL 210 while removing little or none of the remainder of first EDL 204. For example, when patterned second EDL 210 is oxide and first EDL 204 is nitride, a wet oxide etch is preferred.

FIG. 2o shows the wafer after an etch of feature layer 203. Feature 220 has been formed from first area 215 of feature layer 203, and feature 221 has been formed from third area 218 of feature layer 203. An anisotropic etch, such as a plasma or a reactive ion etch, is preferred so that the length 222 of feature 220 is approximately equal to the length 212 of spacer 213.

FIG. 2p shows the wafer after a seal layer 223 has been formed to protect the edges of feature 220 during subsequent processing. Seal layer 223 is preferably a thermally grown oxide.

FIG. 2q shows the wafer after the remainder of spacer layer 221, including spacer 213, and the remainder of first EDL 204 have been etched away. In this embodiment, feature 220 is the gate electrode of a future MOS transistor. The remainder of the transistor structure can be formed using conventional MOS processing.

An alternative approach begins with the same flow as that illustrated by FIGS. 2a through 2g. Following the formation of spacer layer 211, however, trim mask 224 is formed as shown in FIG. 2i-2. Next, trim etch removes substantially all of the material of spacer layer 211, patterned second EDL 210, and first EDL 204 that is not covered by trim mask 224. The resulting structure is shown in FIG. 2j-2. Trim etch is followed by an etch of patterned second EDL 210. An isotropic etch is preferred to remove substantially all of the material of patterned second EDL 210 between ledge 225 of first EDL 204 and ledge 226 of spacer layer 211. The resulting structure is shown in FIG. 2k-2. Next, trim mask 224 is removed, resulting in the structure as shown in FIG. 2l-2. Then, an etch is performed to remove substantially all of spacer layer 211 that is not adjacent to an edge of patterned second EDL 210 and then substantially all of first EDL 204 that is not underneath patterned second EDL 210 or what remains of spacer layer 211. An anisotropic etch, such as a plasma or a reactive ion etch, is preferred so that the length 212 of spacer 213 remains approximately equal to the former thickness of spacer layer 211. The resulting structure is shown in 2m. The alternative approach ends with the same flow as that illustrated by FIGS. 2n through 2q.

Thus a two-mask process using double edge definition layers is described that will allow an MOS transistor electrode with a target dimension of less than 250 nm to be fabricated on a semiconductor wafer. The two-mask process also reduces the process complexity associated with the three-mask process. Further, the two-mask process using double edge definition layers more easily integrates into a mainstream MOS process than the three-mask process.

FIGS. 3a through 3m depict an embodiment of the present invention in which a two-mask SG process using a single edge definition layer is used to fabricate a feature in an integrated circuit. This embodiment includes the formation of an edge definition layer that is patterned to provide an edge on which to form the spacer. The spacer is formed by conformally depositing, then anisotropically etching a spacer layer. The spacer is used to define a feature in the polysilicon layer by protecting the polysilicon underneath the spacer during a subsequent polysilicon etch. In this embodiment, as above, the feature is the gate electrode of an MOS transistor.

Figure 3A:
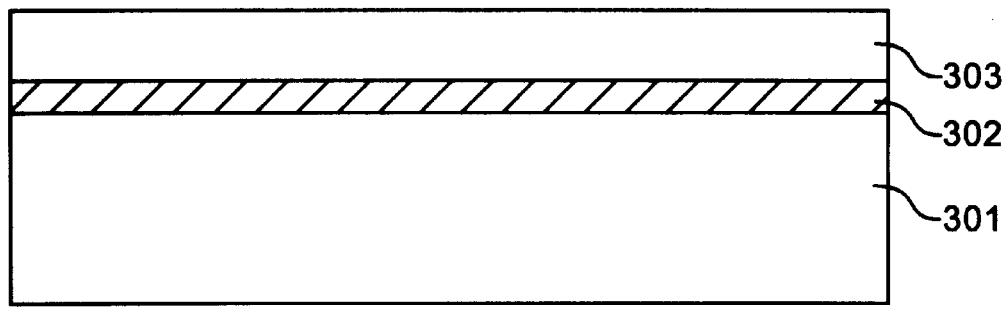
FIG. 3a is a cross-sectional illustration of a semiconductor wafer upon which a feature will be formed according to an embodiment of the present invention.

FIG. 3a shows a semiconductor substrate 301 with a gate dielectric layer 302 formed thereon. A feature layer 303 has been formed by any well-known technique on gate dielectric layer 302. The materials and thickness of the respective layers may be the same as those previously discussed in the above embodiment (see FIG. 2a). In this embodiment, the feature layer 303 comprises polysilicon, from which the gate electrode of an MOS transistor will be fabricated.

Figure 3B:
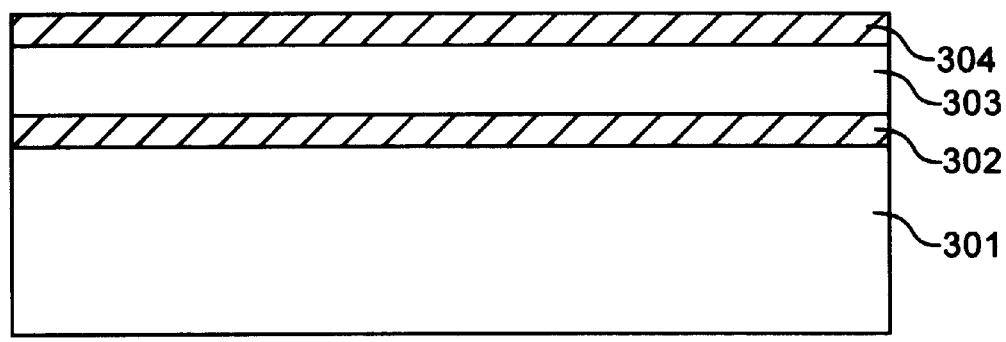
FIG. 3b is an illustration of the wafer of FIG. 3a after an EDL has been formed.

FIG. 3b shows the wafer after an edge definition layer (EDL) 304 has been formed by any well-known technique. EDL 304 can comprise any material used in semiconductor processing, such as but not limited to insulating materials comprising silicon nitride or silicon dioxide. In this embodiment, EDL 304 preferably comprises silicon oxide. EDL 304 is preferably thick enough to act as a mask for a subsequent etch of feature layer 303, yet not so thick as to unnecessarily increase processing time or cost. The preferred thickness of EDL 304 is between 100 nm and 300 nm.

Figure 3C:
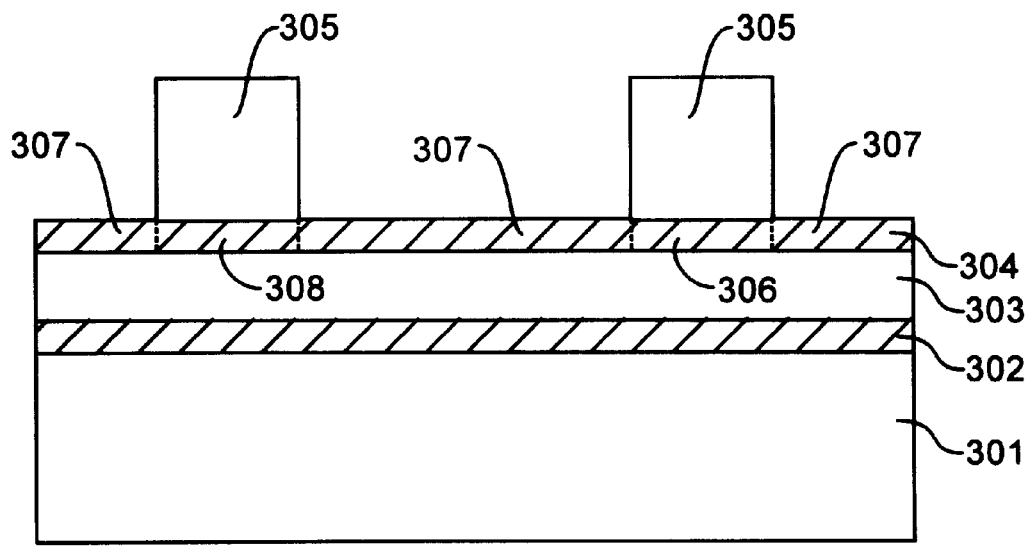
FIG. 3c is an illustration of the wafer of FIG. 3a during the edge definition masking step.

FIG. 3c shows the wafer during edge definition, the first masking step of the process of this embodiment. Edge definition mask 305 has been formed over a first area 306 of EDL 304, but not over a second area 307 of EDL 304. Edge definition mask 305 is used to define a pattern in EDL 304 so that spacers can be formed on the edges of the pattern. In this embodiment, a spacer is used to define the minimum length gate electrode of an MOS transistor. Edge definition mask 305 can also be used to protect areas of EDL 304, under which feature layer 303 will be preserved, to form features that are not of the same length as the gate electrode defined by the spacer. Such features can be, but are not limited to, transistor gate electrodes of greater than minimum length, polysilicon interconnect lines, and polysilicon contact pads. For example, in FIG. 3C, edge definition mask 305 has been formed over a third area 308 of EDL 304. Edge definition mask 305 is preferably formed from a photoresist material using conventional photolithography techniques.

Figure 3D:
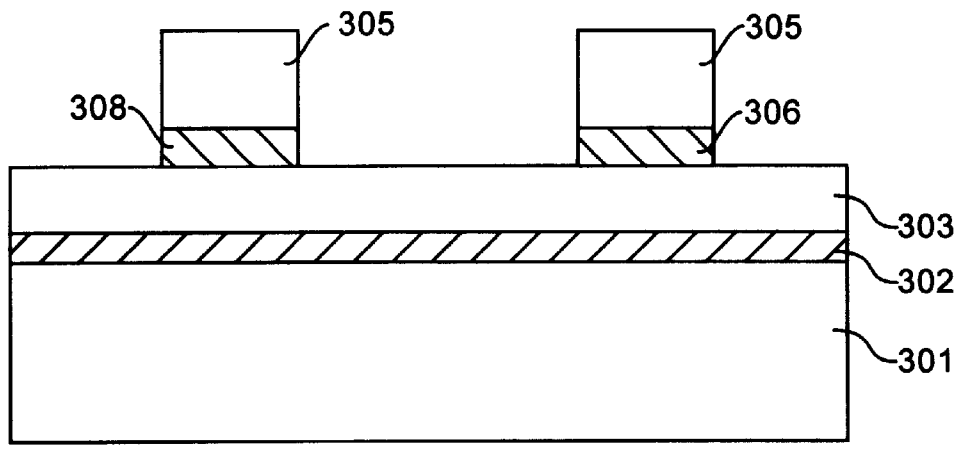
FIG. 3d is an illustration of the wafer of FIG. 3a after a patterned EDL has been formed.
Figure 3E:
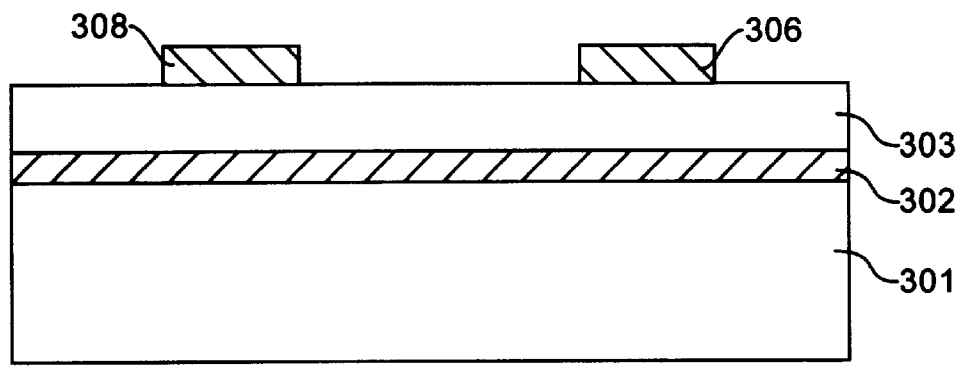
FIG. 3e is an illustration of the wafer of FIG. 3a after the edge definition mask has been removed.

FIG. 3d shows the wafer after the second area 307 of EDL 304 has been etched away to form a patterned EDL comprised of areas 308 and 306. An anisotropic etch, such as a plasma etch or a reactive ion etch, is preferred so that the resulting edges in EDL areas 306 and 308 are substantially vertical. The etch preferably does not remove a significant amount of feature layer 303. FIG. 3e then shows the wafer after edge definition mask 305 has been removed. Techniques for removing conventional photoresist masks are well-known in the art.

Figure 3F:
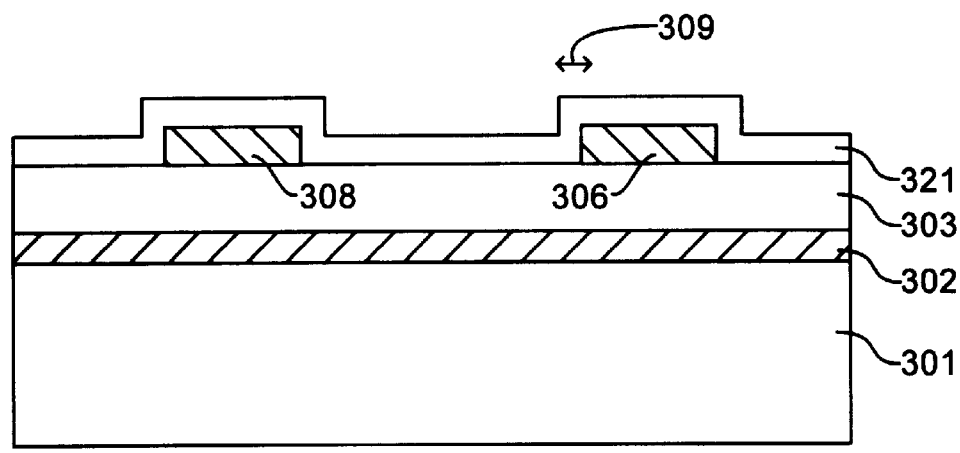
FIG. 3f is an illustration of the wafer of FIG. 3a after a spacer layer has been formed.

FIG. 3f shows the wafer after a spacer layer 321 has been formed. Spacer layer 321 can comprise any material used in semiconductor processing, such as but not limited to insulating materials comprising silicon nitride or silicon dioxide. In this embodiment, spacer layer 321 comprises silicon nitride. Spacer layer 321 is conformally deposited such that the shape of the underlying topography determines the shape of spacer layer 321. Therefore, the length 309 of spacer layer 321 adjacent to an edge of patterned EDL 306 is approximately equal to the thickness of spacer layer 321. Consequently, the length of the feature defined by the future spacer will be directly related to the thickness of spacer layer 321. Because conventional photolithography is generally acceptable for defining features with lengths greater than 150 nm, the thickness of spacer layer 321 is preferably below 150 nm and more preferably approximately 100 nm. Spacer layer 321 can be formed using well-known techniques such as low-pressure chemical vapor deposition.

Figures 1, 3G:
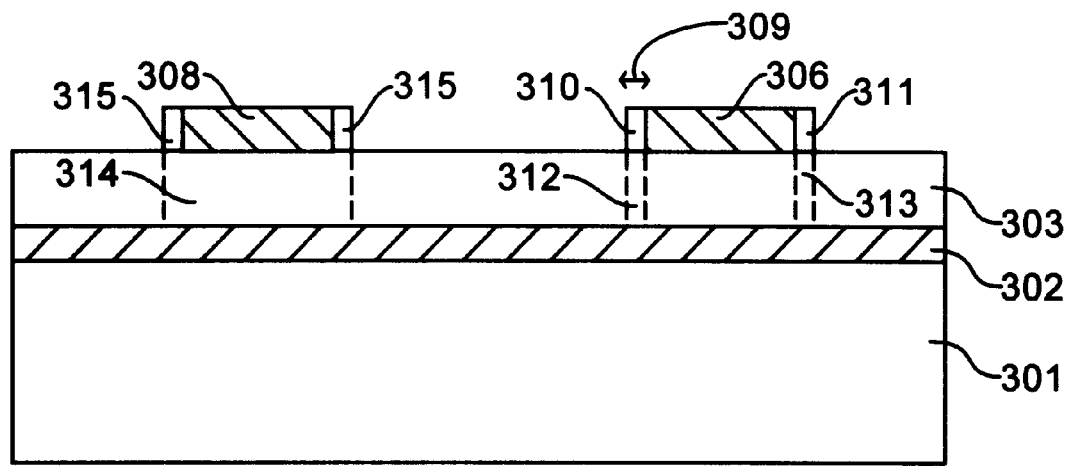
Figures 2, 3G:
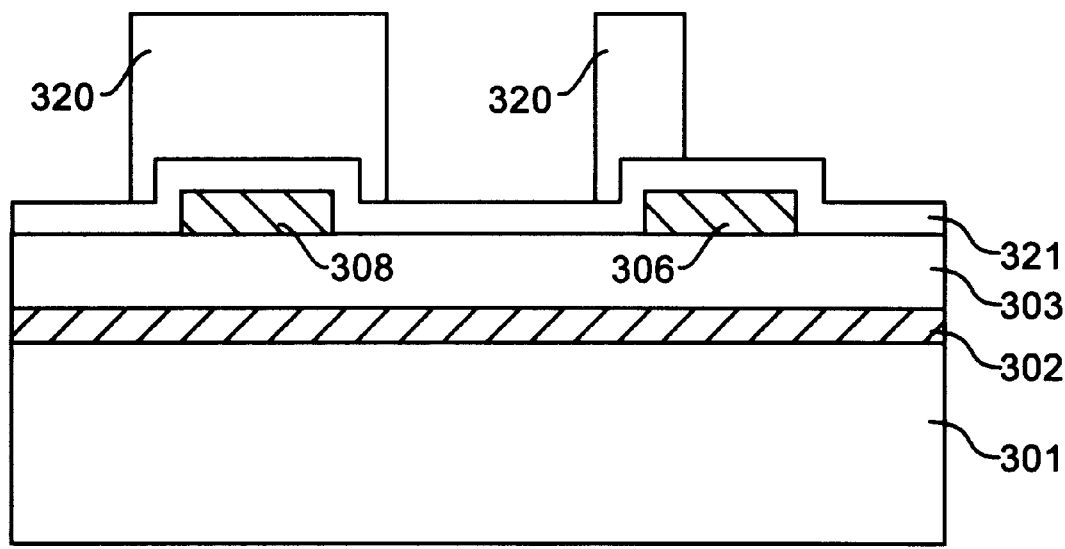

FIG. 3g-1 shows the wafer after spacer etch, which removes substantially all of spacer layer 321 that is not adjacent to an edge of patterned EDL areas 306 and 308, such that spacers 310 and 311 are formed. Spacer etch is preferably an anisotropic etch, such as a plasma or reactive ion etch, so that the length 309 of spacer 310 remains approximately equal to the former thickness of spacer layer 321. Note that an oxide layer may have been formed on the exposed feature layer 303 before the spacer layer 321 was formed. Such a layer would assist in stopping the spacer etch before the feature layer 303 is etched.

Spacer 310 covers a first area 312 of feature layer 303 that will become the gate electrode of an MOS transistor. Spacer 311, on the other hand, covers a second area 313 of feature layer 303 that will need to be removed in order to prevent the formation of an undesired continuous ring of feature layer material around the perimeter of patterned EDL area 306. Therefore, spacer 311 will be removed during nitride trim, the second and final masking step of the process of the embodiment. A third area 314 of feature layer 303, covered by patterned EDL area 308 and spacers 315, can be preserved to form features that are not of the same length as the gate electrode defined by spacer 310. Such features can be, but are not limited to transistor gate electrodes of greater than minimum length, polysilicon interconnect lines, and polysilicon contact pads.

Figures 1, 3H:
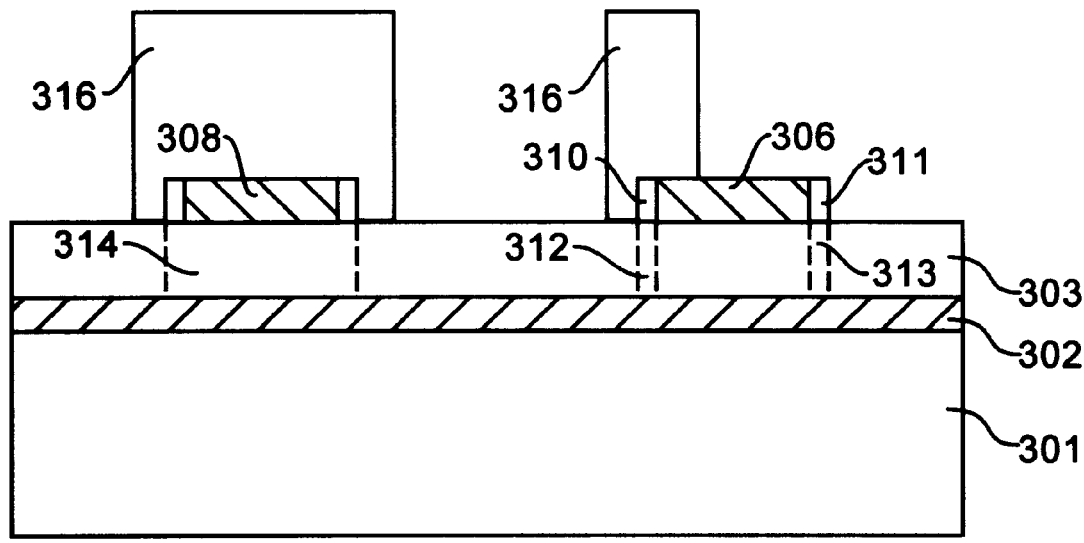
Figures 2, 3H:
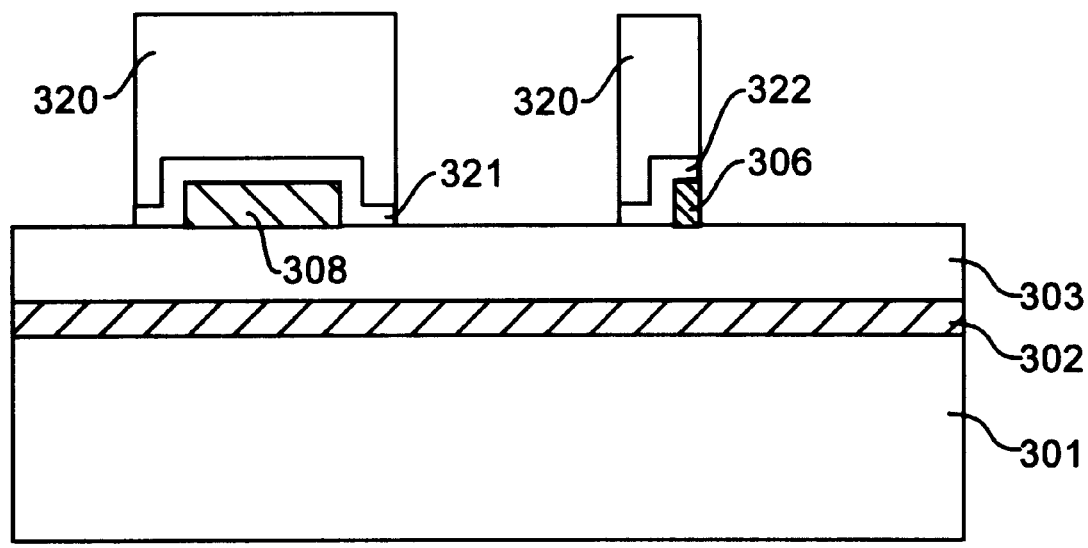

FIG. 3h-1 shows the wafer during the second masking step. Trim mask 316 has been formed over spacer 310 but not over spacer 311. Trim mask 316 can also be used to protect area 308 of patterned EDL, under which feature layer 303 will be preserved to form features that are not of the same length as the gate electrode defined by the spacer. Trim mask 316 is preferably formed from a photoresist material using conventional photolithography techniques.

Figures 1, 3I:
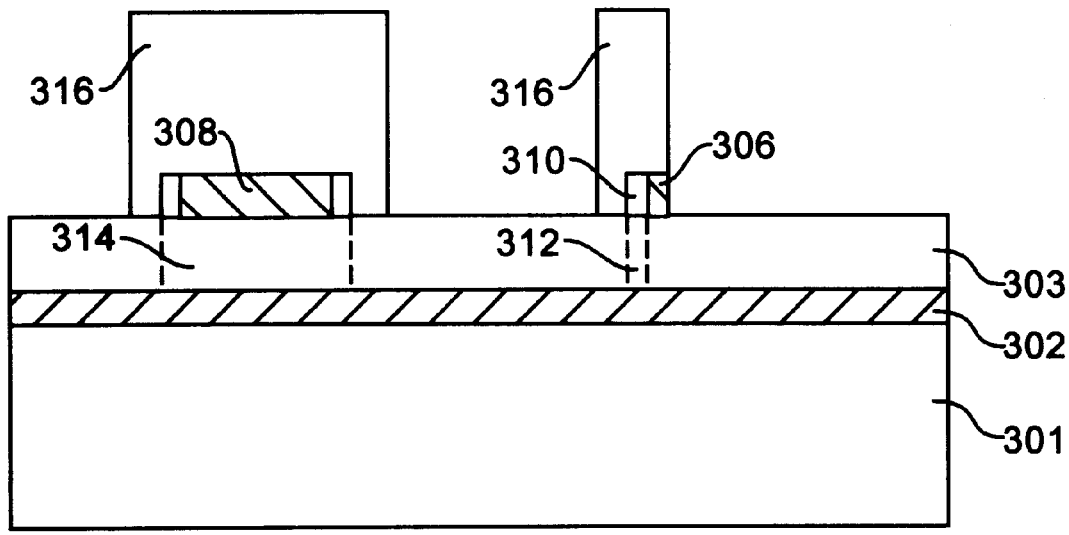
Figures 2, 3I:
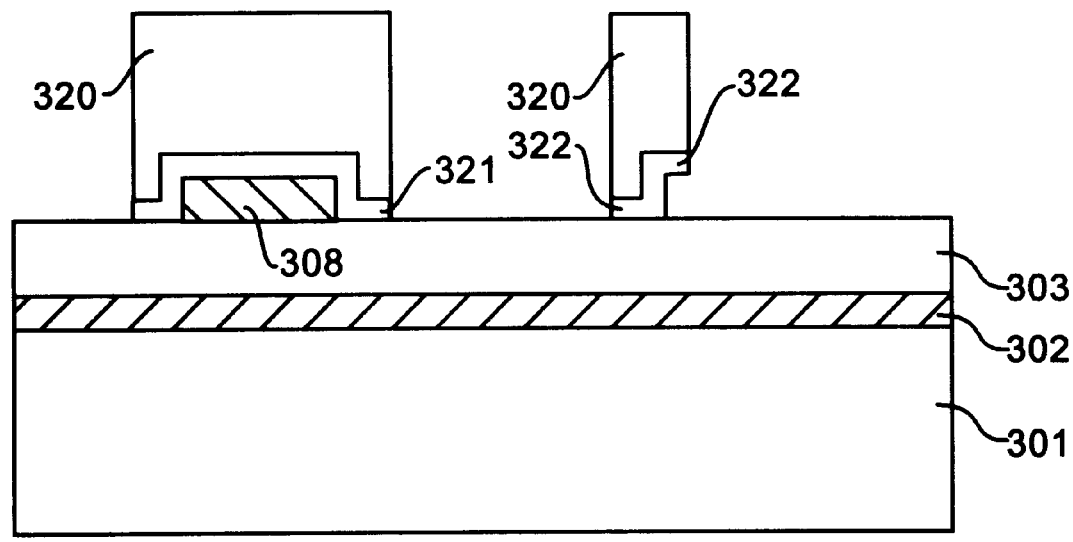

FIG. 3i-1 shows the wafer after trim etch. Trim etch removes spacer 311, and preferably substantially all of patterned EDL area 306 that is not covered by trim mask 216. Techniques for performing trim etch are well known in the art.

Figures 1, 3J:
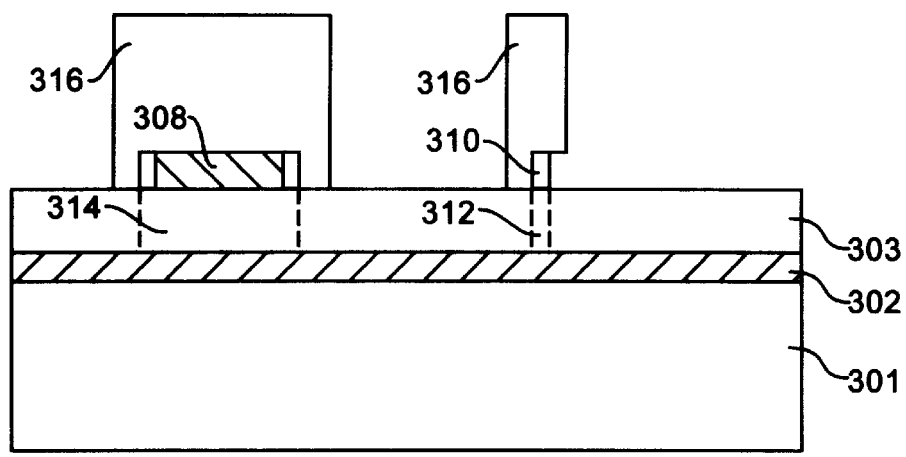
Figures 2, 3J:
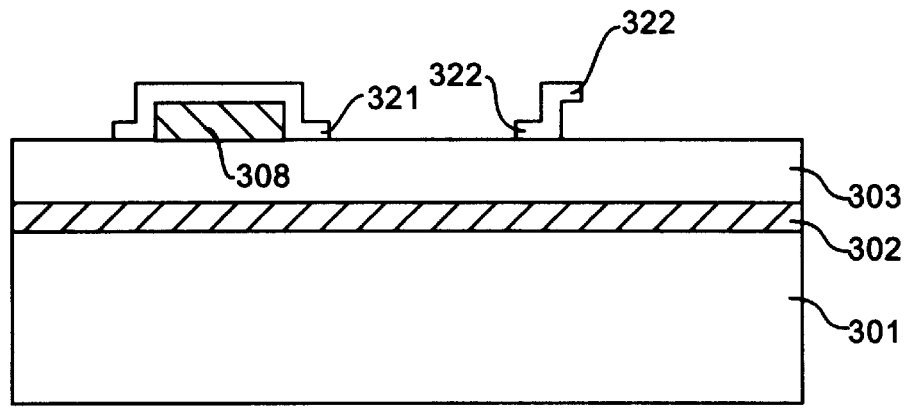
Figure 3K:
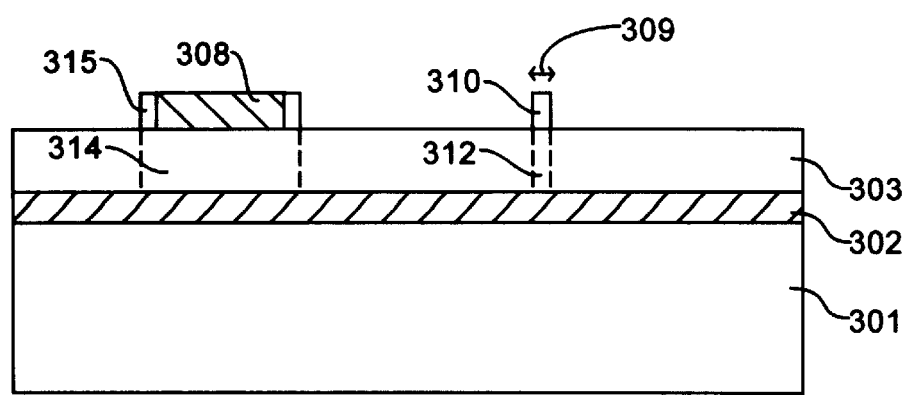
FIG. 3k is an illustration of the wafer of FIG. 3a after the trim mask has been removed.
Figures 1, 3I:
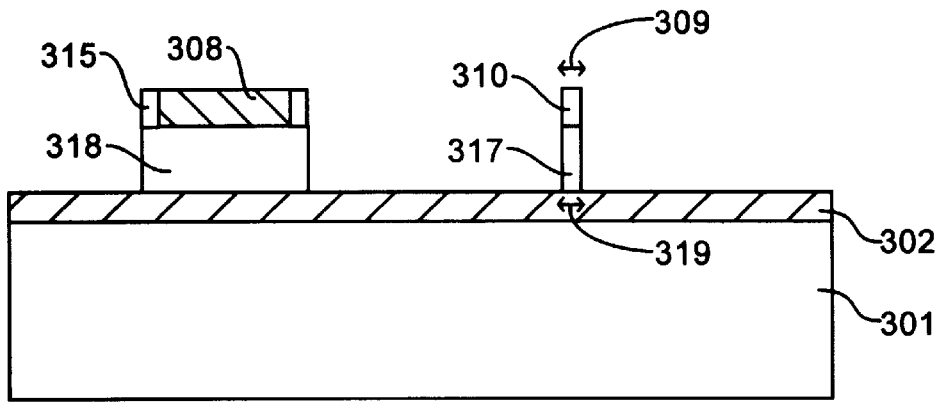
Figures 2, 3I:
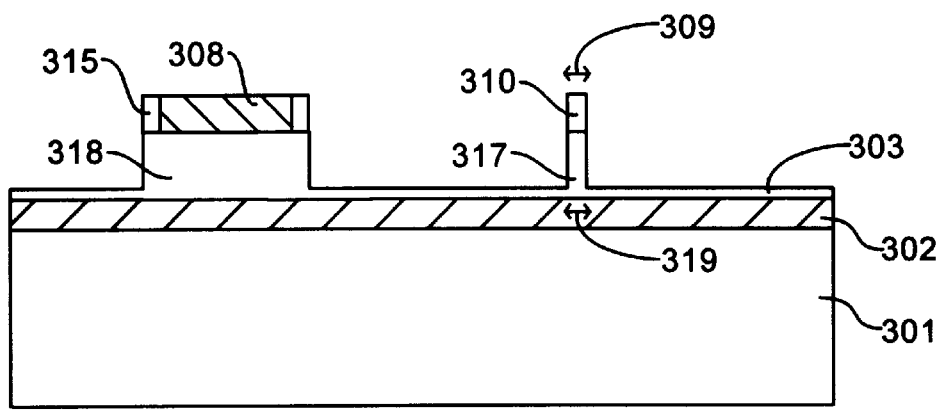

FIG. 3j-1 shows the wafer after an etch of patterned EDL area 306. An isotropic etch, such as a wet etch, is preferred so that substantially all of the material of the patterned EDL area 306 that is adjacent to spacer 310 is removed. FIG. 3k shows the wafer after trim mask 316 has been removed. Techniques for removing conventional photoresist masks are well known in the art.

FIG. 3l-1 shows the wafer after an etch of feature layer 303. Feature 317 has been formed from first area 312, and feature 318 has been formed from third area 314 of feature layer 303. An anisotropic etch, such as a plasma or a reactive ion etch, is preferred so that the length 319 of feature 317 is approximately equal to the length 309 of spacer 310.

Figures 3, 3I:
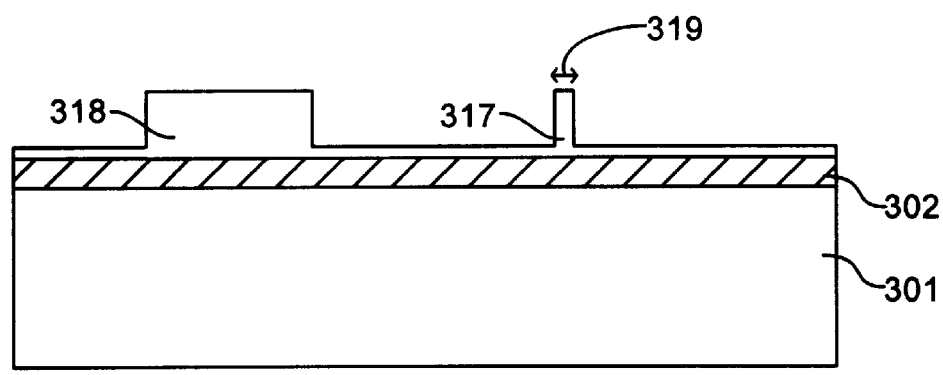
Figure 3M:
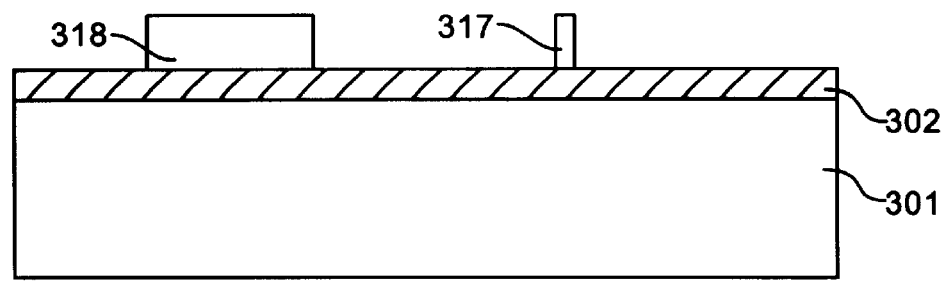
FIG. 3m is an illustration of the wafer of FIG. 3a after the spacer has been etched away.

FIG. 3m shows the wafer after the remainder of spacer layer 321, including spacers 310 and 315, and the patterned EDL area 308 have been etched away. In this embodiment, feature 317 is the gate electrode of a future MOS transistor. The remainder of the transistor structure can be formed using conventional MOS processing.

An alternative approach to a two-mask SG process using a single edge definition layer begins with the same process flow as that illustrated by FIGS. 3a–3f. In this second approach, however, the spacer etch is delayed until after the etch of the feature layer. FIGS. 3g-2 through 3j-2 show the modified process flow of a second approach of fabricating a feature in an integrated circuit using a two-mask SG process.

Following the formation of spacer layer 321 (shown in FIG. 3f), trim mask 320 is formed as shown in FIG. 3g-2. Trim mask 320 has been formed over patterned EDL area 308, under which feature layer 303 will be preserved to form features that are not of the same length as the gate electrode. Trim mask 320 has also been formed over a portion of patterned EDL area 306 and its adjacent spacer layer 321, under which feature layer 303 will be preserved to form the gate electrode. Trim mask 320 is preferably formed from a photoresist material using conventional photolithography techniques.

FIG. 3h-2 shows the wafer after trim etch. Trim etch removes substantially all of the spacer layer 321 not covered by trim mask 320 and substantially all of patterned EDL area 306 that is not covered by trim mask 320. Techniques for performing trim etch are well known in the art.

FIG. 3i-2 shows the wafer after an oxide etch of patterned EDL area 306. An isotropic etch, such as a wet etch, is preferred so that substantially all of the material of the patterned EDL area 306 that is between the upper ledge 322 of former spacer layer 308 and the feature layer 303 is removed. FIG. 3j-2 shows the wafer after trim mask 320 has been removed. Techniques for removing conventional photoresist masks are well known in the art.

Once the trim mask 320 is removed, an etch is performed to remove substantially all of the remaining spacer layer 321 that is not adjacent to the patterned EDL area 308 including the upper and lower ledges 322. An anisotropic etch, such as a plasma or reactive ion etch, is preferred so that the length 309 of spacer 210 remains approximately equal to the former thickness of spacer layer 321. The resulting structure is shown in FIG. 3k. The second approach ends with the same flows as that illustrated by FIGS. 3l-1 through 3m.

This first alternate approached shown in FIGS. 3g-2 through 3j-2 is a simpler and thus less expensive process flow than that described in the previous process flow illustrated in FIGS. 3g-1 through 3j-1. With the trim etch (FIG. 3h-2), oxide etch (FIG. 3l-2), nitride etch (FIG. 3k), and feature layer etch (FIG. 3l-1) in series, it is possible to combine some of the steps into one etch, thus simplifying the process flow even further. For example, it is possible to perform an anisotropic nitride etch, then switch the process to etch the feature layer 303 (need to be selective to nitride and oxide). After the feature layer 303 etch, which will stop on the gate oxide layer 302, then the process can switch to etch the remaining oxide/nitride (need to be selective to polysilicon). Further, since the etching processes typically occur in a vacuum environment, this first alternate approach eliminates the need to break the vacuum and transfer the wafer to another set of equipment. Thus, the first alternate approach not only simplifies the process complexity, but also prevents the wafer from being exposed to ambient conditions during the process flow.

With each of the above approaches, it is difficult to remove the remaining patterned EDL area 308 and spacers 315 and 310 after etching the feature layer 303 without damaging other structures (see FIG. 3m). For example, it may not be possible to remove the EDL area 308 (comprised of silicon oxide) without also etching the field oxide or trench fill oxide. Thus, an alternative approached addresses this issue by doing a partial etch of the feature layer 303 first. FIGS. 3l-2 and 3l-3 show the modified process flow of this approach to fabricating a feature in an integrated circuit using a two-mask SG process. Note that this third approach may be used with either of the first two approaches described above.

In this alternate approach, a partial etch is performed, as shown in FIG. 3l-2, to remove a portion of the feature layer 303. As above, an anisotropic etch, such as a plasma or a reactive ion etch, is preferred so that the length 319 of feature 317 is approximately equal to the length 309 of spacer 310. Next, the remainder of spacer layer 321 and the patterned EDL area 308 are etched away.

FIG. 3l-3 shows the wafer after the remainder of spacer layer 321, including spacers 310 and 315, and the patterned EDL area 308 have been etched away. The partial feature layer 303 protects the gate dielectric layer 302 and any other underlying structures from the etching process. Finally, the remainder of feature layer 303 is etched away and feature 317, in this embodiment the gate electrode of a future MOS transistor, is fabricated as shown in FIG. 3m. The remainder of the transistor structure can be performed using conventional MOS processing.

Thus, a two-mask process for fabricating a feature on an integrated circuit is described. The process flows described above provides several advantages over conventional photolithography by allowing features, such as the gate electrode of an MOS transistor, to be fabricated with lengths below 150 nm. Further, the two mask process reduces the process complexity and costs associated with the previous three-mask process and more easily integrates into a mainstream MOS process.

We claim:

1. A method of fabricating a feature on a substrate comprising:

forming a feature layer on said substrate;

forming a patterned edge definition layer on said feature layer;

forming a spacer adjacent to said patterned edge definition layer, said spacer covering first and second areas of said feature layer;

forming a trim mask over said spacer covering said first and second areas of said feature layer; and, etching a third area of said feature layer to form first and second features from said first and second areas of said feature layer.

2. The method of claim 1 wherein the patterned edge definition layer comprises silicon nitride.

3. The method of claim 1 wherein the spacer comprises silicon nitride.

4. The method of claim 1 wherein the feature layer comprises polysilicon.

5. The method of claim 1 wherein the feature layer comprises aluminum.

6. The method of claim 1 wherein the feature layer comprises copper.

7. The method of claim 1 wherein etching the third area of said feature layer includes forming a transistor gate electrode from said first area of said feature layer.

8. A method of fabricating a feature on a substrate comprising:

forming a feature layer on said substrate;

forming a patterned edge definition layer on said feature layer;

forming a spacer layer on said patterned edge definition layer;

etching said spacer layer to form a spacer adjacent to an edge of said patterned edge definition layer, said spacer covering first and second areas of said feature layer;

forming a trim mask over said spacer covering said first and second areas of said feature layer;

etching said patterned edge definition layer to uncover a third area of said feature layer; and, etching said third area of said feature layer to form first and second features from said first and second areas of said feature layer.

9. The method of claim 8 wherein the patterned edge definition layer comprises silicon nitride.

10. The method of claim 8 wherein the patterned edge definition layer comprises silicon dioxide.

11. The method of claim 8 wherein the spacer comprises silicon nitride.

12. The method of claim 8 wherein the spacer comprises silicon dioxide.

13. The method of claim 8 wherein the feature layer comprises polysilicon.

14. The method of claim 8 wherein the feature layer comprises aluminum.

15. The method of claim 8 wherein the feature layer comprises copper.

16. The method of claim 8 wherein etching the third area of said feature layer includes forming a transistor gate electrode from said first area of said feature layer.

17. A method of fabricating a feature on a substrate comprising:

forming a feature layer on said substrate;

forming an edge definition layer on said feature layer;

forming an edge definition mask over a first area of said edge definition layer;

etching a second area of said edge definition layer to form a patterned edge definition layer;

removing said edge definition mask;

forming a spacer layer on said patterned edge definition layer;

etching said spacer layer to form a spacer adjacent to an edge of said patterned edge definition layer, said spacer covering a first area of said feature layer;

forming a trim mask over said spacer covering first and second areas of said feature layer;

etching said patterned edge definition layer to substantially uncover a third area of said feature layer;

removing said trim mask; and, etching said third area of said feature layer to form said feature from said first area of said feature layer.

18. The method of claim 17 wherein the edge definition layer comprises silicon nitride.

19. The method of claim 17 wherein the spacer layer comprises silicon dioxide.

20. The method of claim 17 wherein the feature layer comprises polysilicon.

21. The method of claim 17 wherein etching said third area of said feature layer includes forming a transistor gate electrode from said first area of said feature layer.

22. The method of claim 17 wherein:

forming said edge definition mask includes forming said edge definition mask over a third area of said edge definition layer; and, etching said third area of said feature layer includes forming a transistor gate electrode from said first area of said feature layer and a second feature from said second area of said feature layer.

23. A method of fabricating a feature on a substrate comprising:

forming a feature layer on said substrate;

forming an edge definition layer on said feature layer;

forming an edge definition mask over a first area of said edge definition layer;

etching a second area of said edge definition layer to form a patterned edge definition layer;

forming a spacer layer on said patterned edge definition layer;

forming a trim mask over first and second areas of said spacer layer and said patterned edge definition layer;

etching a third area of said spacer layer and said patterned edge definition layer;

removing said trim mask;

etching said first area of said spacer layer to form a spacer coveting first and second areas of said feature layer; and, etching a third area of said feature layer to form first and second features from said first and second areas of said feature layer.

24. The method of claim 23 wherein the patterned edge definition layer comprises silicon nitride.

25. The method of claim 23 wherein the spacer layer comprises silicon dioxide.

26. The method of claim 23 wherein the feature layer comprises polysilicon.

27. The method of claim 23 wherein etching said third area of said feature layer includes forming a transistor gate electrode from said first area of said feature layer.

28. The method of claim 23 wherein:

forming said edge definition mask includes forming said edge definition mask over a first area and a third area of said edge definition layer; and, etching said third area of said feature layer includes forming a transistor gate electrode from said first area of said feature layer and forming a second feature from said second area of said feature layer.

* * * * *

UNITED STATES PATENT AND TRADEMARK OFFICE
CERTIFICATE OF CORRECTION

PATENT NO.    : 6,162,696
DATED         : December 19, 2000
INVENTOR(S)   : Cheng et al.

It is certified that error appears in the above-identified patent and that said Letters Patent is hereby corrected as shown below:

Column 1,
Line 49, delete "each", insert -- etch --.

Signed and Sealed this

Fourth Day of June, 2002

Attest:

Attesting Officer

JAMES E. ROGAN
Director of the United States Patent and Trademark Office